US00RE45840E

(19) United States
(12) Reissued Patent
Katsumata et al.

(10) Patent Number: US RE45,840 E
(45) Date of Reissued Patent: Jan. 12, 2016

(54) NONVOLATILE SEMICONDUCTOR MEMORY DEVICE AND METHOD FOR DRIVING SAME

(71) Applicant: KABUSHIKI KAISHA TOSHIBA, Minato-ku (JP)

(72) Inventors: Ryota Katsumata, Mie-ken (JP); Hideaki Aochi, Kanagawa-ken (JP); Hiroyasu Tanaka, Mie-ken (JP); Masaru Kito, Kanagawa-ken (JP); Yoshiaki Fukuzumi, Kanagawa-ken (JP); Masaru Kidoh, Mie-ken (JP); Yosuke Komori, Mie-ken (JP); Megumi Ishiduki, Mie-ken (JP); Junya Matsunami, Kanagawa-ken (JP); Tomoko Fujiwara, Kanagawa-ken (JP); Ryouhei Kirisawa, Kanagawa-ken (JP); Yoshimasa Mikajiri, Mie-ken (JP); Shigeto Oota, Mie-ken (JP)

(73) Assignee: KABUSHIKI KAISHA TOSHIBA, Minato-ku (JP)

(21) Appl. No.: 14/327,359

(22) Filed: Jul. 9, 2014

Related U.S. Patent Documents

Reissue of:

(64) Patent No.: 8,218,358
Issued: Jul. 10, 2012
Appl. No.: 12/851,054
Filed: Aug. 5, 2010

(30) Foreign Application Priority Data

Nov. 2, 2009 (JP) ..... 2009-251891

(51) Int. Cl.
*G11C 11/14* (2006.01)
*H01L 27/115* (2006.01)
(Continued)

(52) U.S. Cl.
CPC ..... *H01L 27/11578* (2013.01); *G11C 16/0466* (2013.01); *G11C 16/06* (2013.01); *H01L 27/11565* (2013.01); *H01L 27/11582* (2013.01)

(58) Field of Classification Search
CPC ..... G11C 16/0466; G11C 16/06; H01L 27/11565; H01L 27/11578; H01L 27/11582
USPC ..... 365/161, 87, 185.23, 230.06, 185.25
See application file for complete search history.

(56) References Cited

U.S. PATENT DOCUMENTS 8,372,720 B2 2/2013 Fukuzumi et al.
2003/0022420 A1* 1/2003 Kleveland et al. ..... 438/131
(Continued)

FOREIGN PATENT DOCUMENTS

JP 2007-266143 10/2007
WO WO 2009/075370 6/2009
(Continued)

OTHER PUBLICATIONS

U.S. Appl. No. 12/679,991, filed Mar. 25, 2010, Yoshiaki Fukuzumi, et al.

*Primary Examiner* — Ovidio Escalante
(74) *Attorney, Agent, or Firm* — Oblon, McClelland, Maier & Neustadt, L.L.P.

(57) ABSTRACT

According to one embodiment, a nonvolatile semiconductor memory device includes a substrate, a stacked body, a semiconductor pillar, a charge storage film, and a drive circuit. The stacked body is provided on the substrate. The stacked body includes a plurality of insulating films alternately stacked with a plurality of electrode films. A through-hole is made in the stacked body to align in a stacking direction. The semiconductor pillar is buried in an interior of the through-hole. The charge storage film is provided between the electrode film and the semiconductor pillar. The drive circuit supplies a potential to the electrode film. The diameter of the through-hole differs by a position in the stacking direction. The drive circuit supplies a potential to reduce a potential difference with the semiconductor pillar as a diameter of the through-hole piercing the electrode film decreases.

30 Claims, 18 Drawing Sheets

(51) Int. Cl.
*G11C 16/04* (2006.01)
*G11C 16/06* (2006.01)

(56) References Cited

U.S. PATENT DOCUMENTS

2007/0097738 A1* 5/2007 Asano et al. ..... 365/163
2007/0252201 A1 11/2007 Kito et al.
2008/0067583 A1* 3/2008 Kidoh et al. ..... 438/591
2010/0012980 A1* 1/2010 Song et al. ..... 438/129
2010/0096682 A1 4/2010 Fukuzumi et al.
2010/0109072 A1 5/2010 Kidoh et al.
2010/0117137 A1 5/2010 Fukuzumi et al.
2011/0069552 A1 3/2011 Itagaki et al.
2011/0175159 A1 7/2011 Itagaki et al.

FOREIGN PATENT DOCUMENTS

WO WO 2009/075370 A1 6/2009
WO WO 2010/035609 4/2010
WO WO 2010/035609 A1 4/2010

* cited by examiner

| | WRITING OPERATION | | READING OPERATION | | ERASING OPERATION |
|---|---|---|---|---|---|
| | SELECTED | UNSELECTED | SELECTED | UNSELECTED | SELECTED BLOCK |
| BIT LINE BL | VALUE "0": $V_{ss}$<br>VALUE "1": $V_{dd}$ | | $V_{bl}$ | | $V_{erase}$ |
| SELECTION GATE ELECTRODE SGb | $V_{sg}$ | $V_{off}$ | $V_{on}$ | $V_{off}$ | $V_{sg}$ |
| CONTROL GATE ELECTRODE CGb (FOURTH LAYER) | $V_{pass}$ | $V_{pass}$ | $V_{read}$ | $V_{read}$ | $V_{ss}$ |
| CONTROL GATE ELECTRODE CGb (THIRD LAYER) | $V_{pgm}$ | $V_{pgm}$ | $V_{ss}$ | $V_{ss}$ | $V_{ss}$ |
| CONTROL GATE ELECTRODE CGb (SECOND LAYER) | $V_{pass}$ | $V_{pass}$ | $V_{read}$ | $V_{read}$ | $V_{ss}$ |
| CONTROL GATE ELECTRODE CGb (FIRST LAYER) | $V_{pass}$ | $V_{pass}$ | $V_{read}$ | $V_{read}$ | $V_{ss}$ |
| BACK GATE BG | $V_{on}$ | | $V_{on}$ | | $V_{on}$ |
| CONTROL GATE ELECTRODE CGs (FIRST LAYER) | $V_{pass}$ | $V_{pass}$ | $V_{read}$ | $V_{read}$ | $V_{ss}$ |
| CONTROL GATE ELECTRODE CGs (SECOND LAYER) | $V_{pass}$ | $V_{pass}$ | $V_{read}$ | $V_{read}$ | $V_{ss}$ |
| CONTROL GATE ELECTRODE CGs (THIRD LAYER) | $V_{pass}$ | $V_{pass}$ | $V_{read}$ | $V_{read}$ | $V_{ss}$ |
| CONTROL GATE ELECTRODE CGs (FOURTH LAYER) | $V_{pass}$ | $V_{pass}$ | $V_{read}$ | $V_{read}$ | $V_{ss}$ |
| SELECTION GATE ELECTRODE SGs | $V_{off}$ | $V_{off}$ | $V_{on}$ | $V_{off}$ | $V_{sg}$ |
| SOURCE LINE SL | $V_{dd}$ | $V_{dd}$ | $V_{ss}$ | $V_{ss}$ | $V_{erase}$ |

FIG. 7

| OPERATION | WRITING OPERATION | READING OPERATION |
|---|---|---|
| DRIVING POTENTIAL | WRITING POTENTIAL $V_{pgm}$ | READING POTENTIAL $V_{read}$ |
| CONTROL GATE ELECTRODE CG4 (FOURTH LAYER) | $V_{pgm}0$ | $V_{read}0$ |
| CONTROL GATE ELECTRODE CG3 (THIRD LAYER) | $V_{pgm}0-\Delta V_{pgm}1$ | $V_{read}0-\Delta V_{read}1$ |
| CONTROL GATE ELECTRODE CG2 (SECOND LAYER) | $V_{pgm}0-\Delta V_{pgm}2$ | $V_{read}0-\Delta V_{read}2$ |
| CONTROL GATE ELECTRODE CG1 (FIRST LAYER) | $V_{pgm}0-\Delta V_{pgm}3$ | $V_{read}0-\Delta V_{read}3$ |

$$\Delta V_{pgm}1<\Delta V_{pgm}2<\Delta V_{pgm}3$$
$$\Delta V_{read}1<\Delta V_{read}2<\Delta V_{read}3$$

FIG. 8

NONVOLATILE SEMICONDUCTOR MEMORY DEVICE AND METHOD FOR DRIVING SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2009-251891, filed on Nov. 2, 2009; the entire contents of which are incorporated herein by reference.

FIELD

Embodiments described herein relate generally to a nonvolatile semiconductor memory device and method for driving the same.

BACKGROUND

Semiconductor memory devices of flash memory and the like conventionally have been constructed by two-dimensionally integrating memory cells on the surface of a silicon substrate. In such a semiconductor memory device, it is necessary to increase the integration of the memory cells to reduce the cost per bit and increase the storage capacity. However, such increases of integration in recent years have become difficult in regard to both cost and technology.

Methods of three-dimensional integration by stacking memory cells have been proposed as technology to breakthrough the limitations of increasing the integration. However, methods that simply stack and pattern one layer after another undesirably increase the number of processes as the number of stacks increases, and the costs undesirably increase. In particular, the increase of lithography processes for patterning the transistor structure is a main cause of increasing costs. Therefore, the reduction of the chip surface area per bit by stacking has not led to lower costs per bit as much as downsizing within the chip plane and is problematic as a method for increasing the storage capacity.

In consideration of such problems, the inventors have proposed a collectively patterned three-dimensionally stacked memory (for instance, refer to JP-A 2007-266143 (Kokai)). In such technology, a stacked body including electrode films alternately stacked with insulative films is formed on a silicon substrate; and subsequently, through-holes are made in the stacked body by collective patterning. A blocking film, a charge storage film, and a tunneling film are deposited in this order to form a memory film on the side face of the through-hole; and a silicon pillar is buried in the interior of the through-hole. A memory transistor is thereby formed at an intersection between each electrode film and the silicon pillar.

In such a collectively patterned three-dimensionally stacked memory, a charge can be removed from and put into the charge storage layer from the silicon pillar to store information by controlling an electrical potential of each electrode film and each silicon pillar. According to such technology, the through-holes are made by collectively patterning the stacked body. Therefore, the number of lithography processes does not increase and cost increases can be suppressed even in the case where the number of stacks of the electrode films increases.

BRIEF DESCRIPTION OF THE DRAWINGS

FIG. 7 is a diagram of potentials applied to each electrode and interconnections during operations of the nonvolatile semiconductor memory device according to first embodiment;

FIG. 8 is a diagram of potentials applied to control gate electrodes of each level during operations of the nonvolatile semiconductor memory device according to the first embodiment;

DETAILED DESCRIPTION

In general, according to one embodiment, a nonvolatile semiconductor memory device includes a substrate, a stacked body, a semiconductor pillar, a charge storage film, and a drive circuit. The stacked body is provided on the substrate. The stacked body includes a plurality of insulating films alternately stacked with a plurality of electrode films. A through-hole is made in the stacked body to align in a stacking direction. The semiconductor pillar is buried in an interior of the through-hole. The charge storage film is provided between the electrode film and the semiconductor pillar. The drive circuit supplies a potential to the electrode film. The diameter of the through-hole differs by a position in the stacking direction. The drive circuit supplies a potential to reduce a potential difference with the semiconductor pillar as a diameter of the through-hole piercing the electrode film decreases.

Exemplary embodiments will now be described with reference to the drawings.

First, a first embodiment of the invention will be described.

Figure 1:
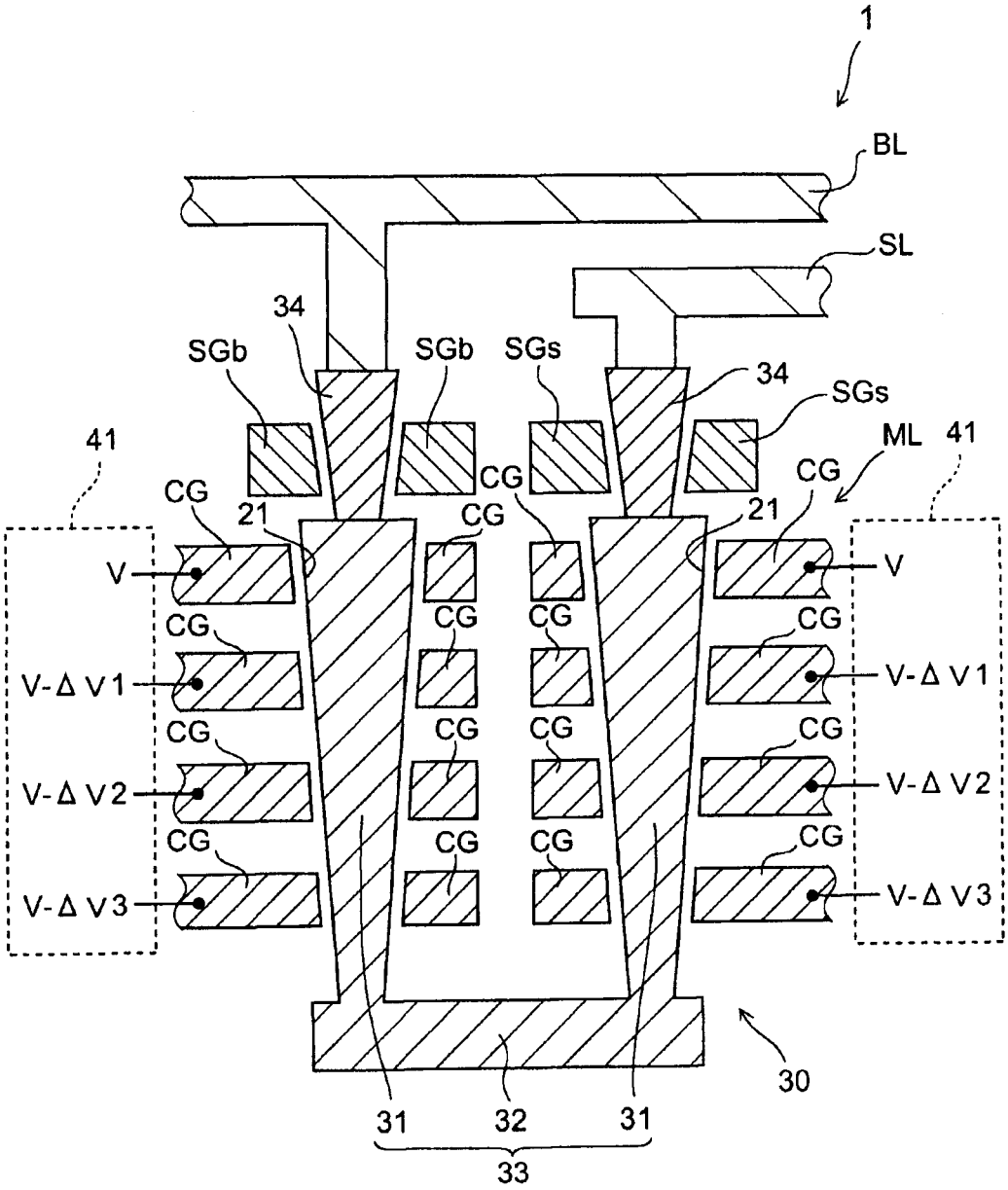
FIG. 1 is a diagram of features of a nonvolatile semiconductor memory device according to a first embodiment.

FIG. 1 schematically illustrates features of a nonvolatile semiconductor memory device according to this embodiment.

Figure 2:
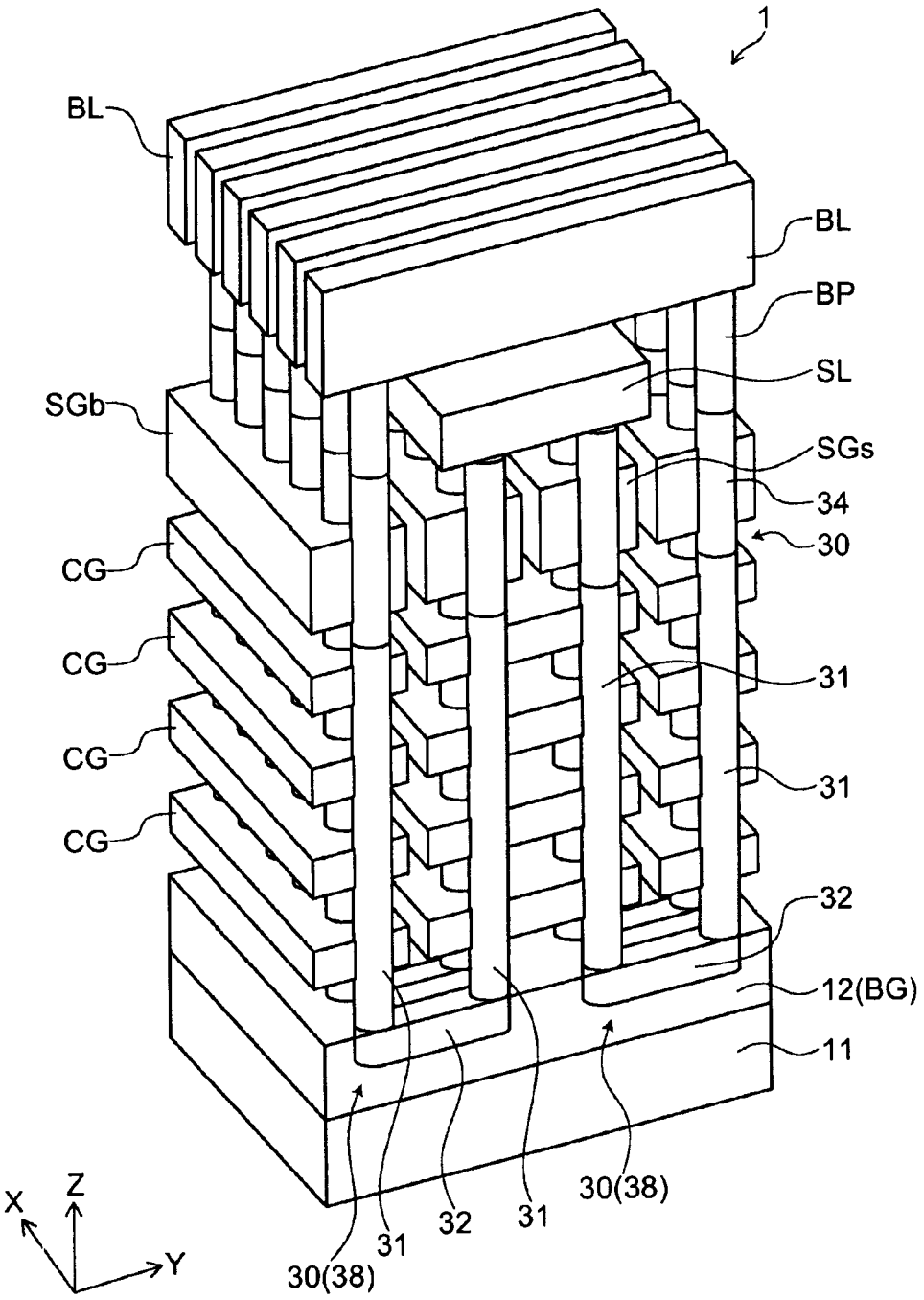
FIG. 2 is a perspective view of the nonvolatile semiconductor memory device according to the first embodiment.

FIG. 2 is a perspective view illustrating the nonvolatile semiconductor memory device according to this embodiment.

Figure 3:
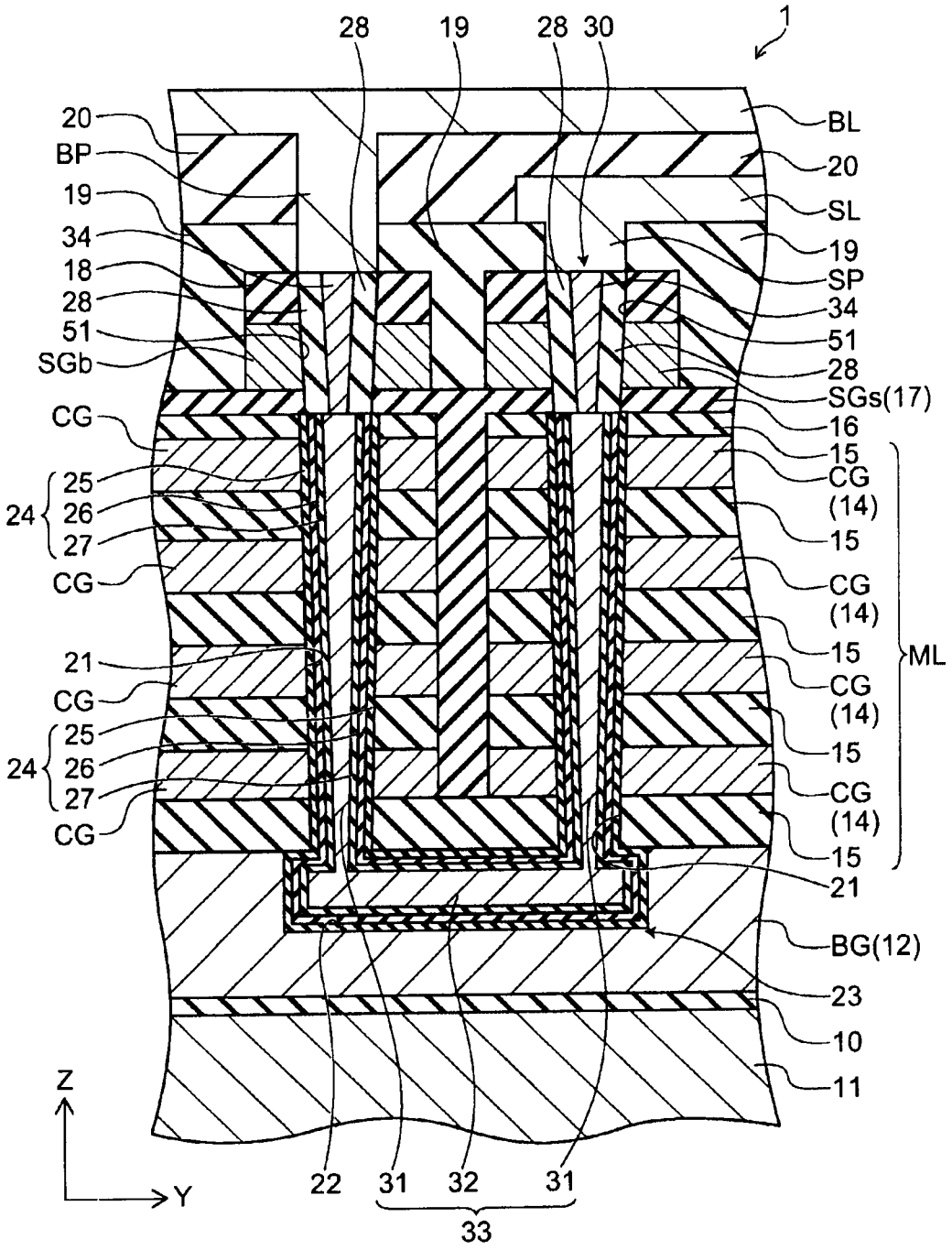
FIG. 3 is a cross-sectional view of the nonvolatile semiconductor memory device according to the first embodiment.

FIG. 3 is a cross-sectional view illustrating the nonvolatile semiconductor memory device according to this embodiment.

Figure 4:
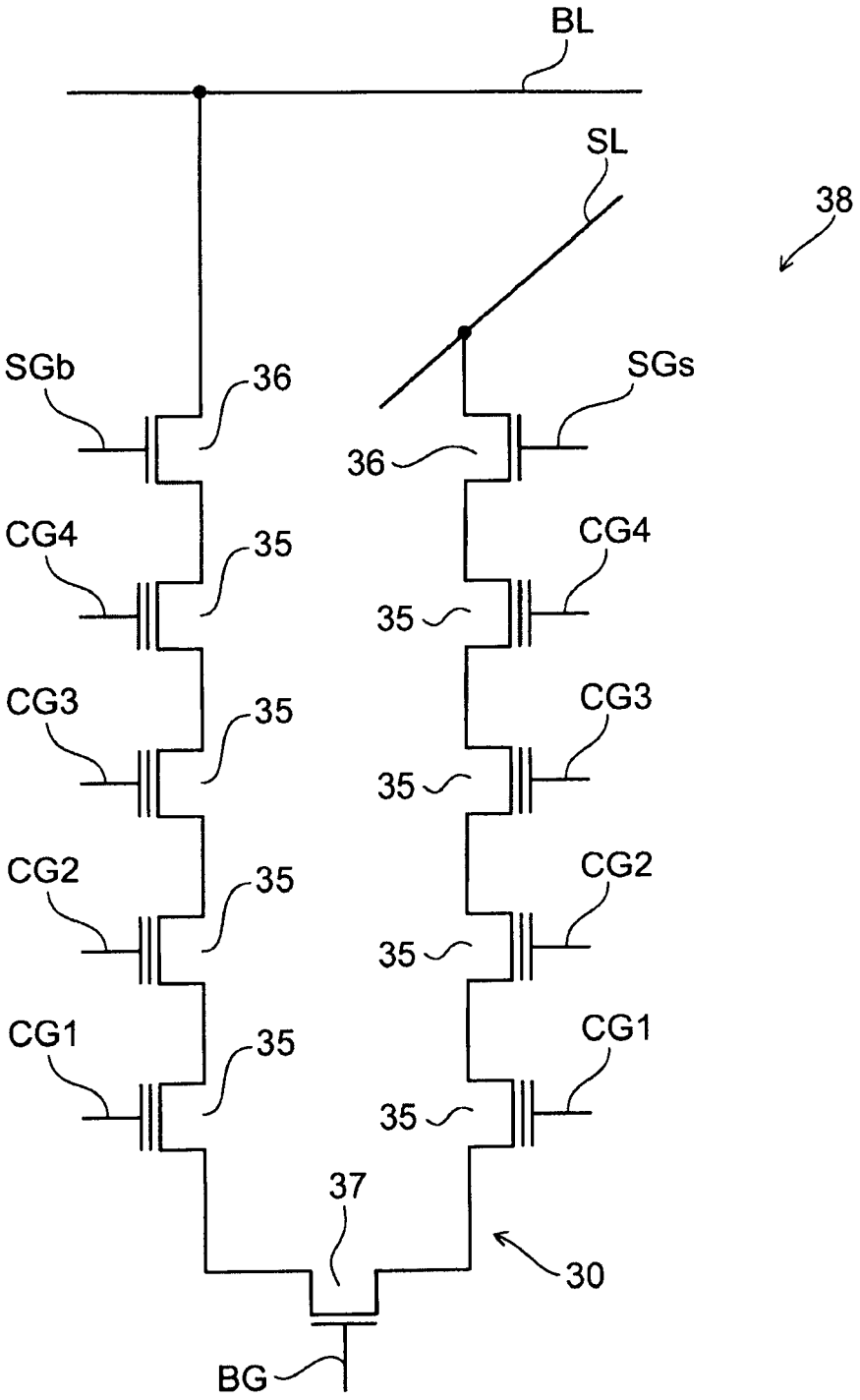
FIG. 4 is a circuit diagram of a memory string of the nonvolatile semiconductor memory device according to the first embodiment.

FIG. 4 is a circuit diagram illustrating a memory string of the nonvolatile semiconductor memory device according to this embodiment.

Figure 5:
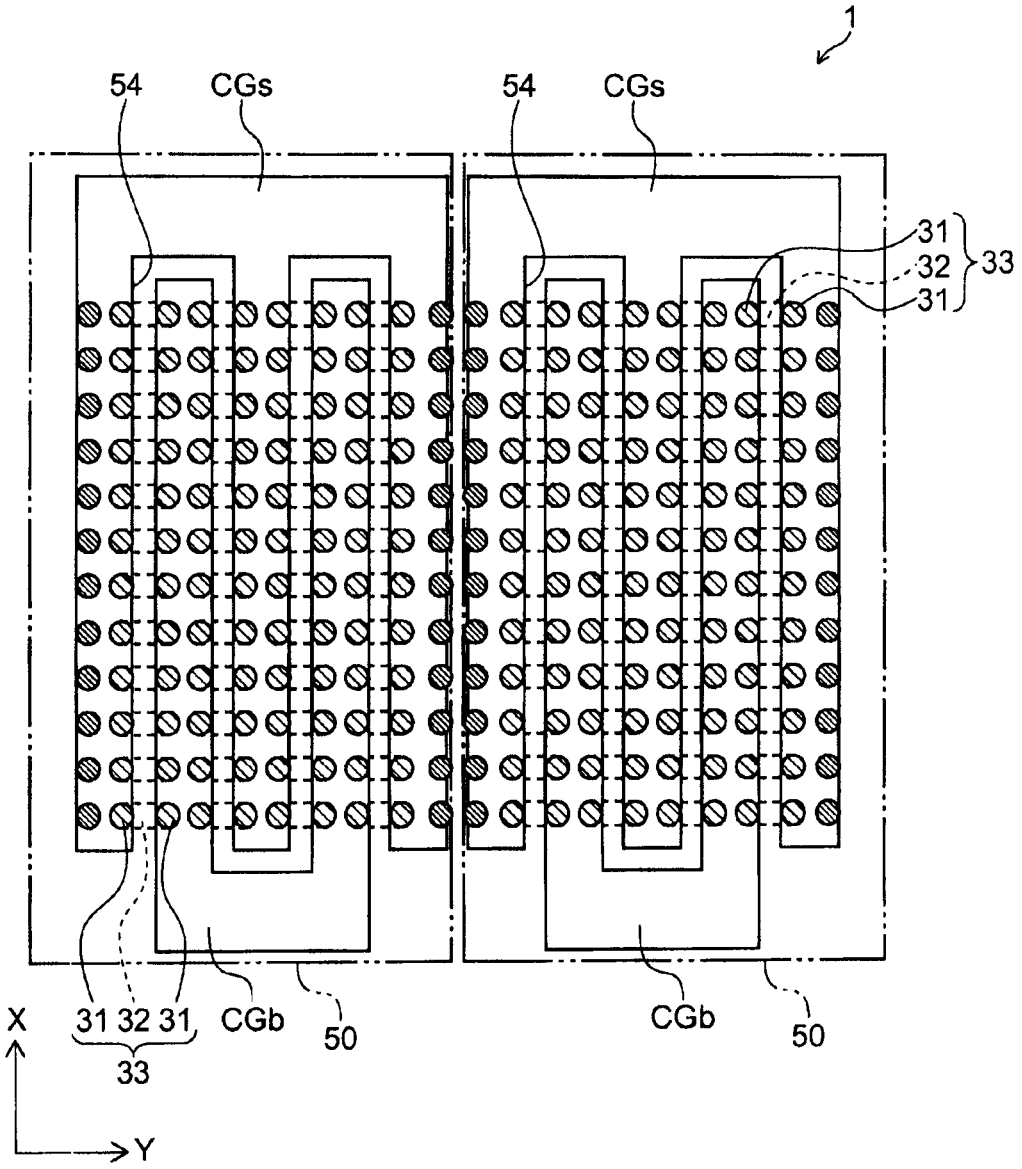
FIG. 5 is a plan view of electrode films of the nonvolatile semiconductor memory device according to the first embodiment.

FIG. 5 is a plan view illustrating electrode films of the nonvolatile semiconductor memory device according to this embodiment.

Figure 6:
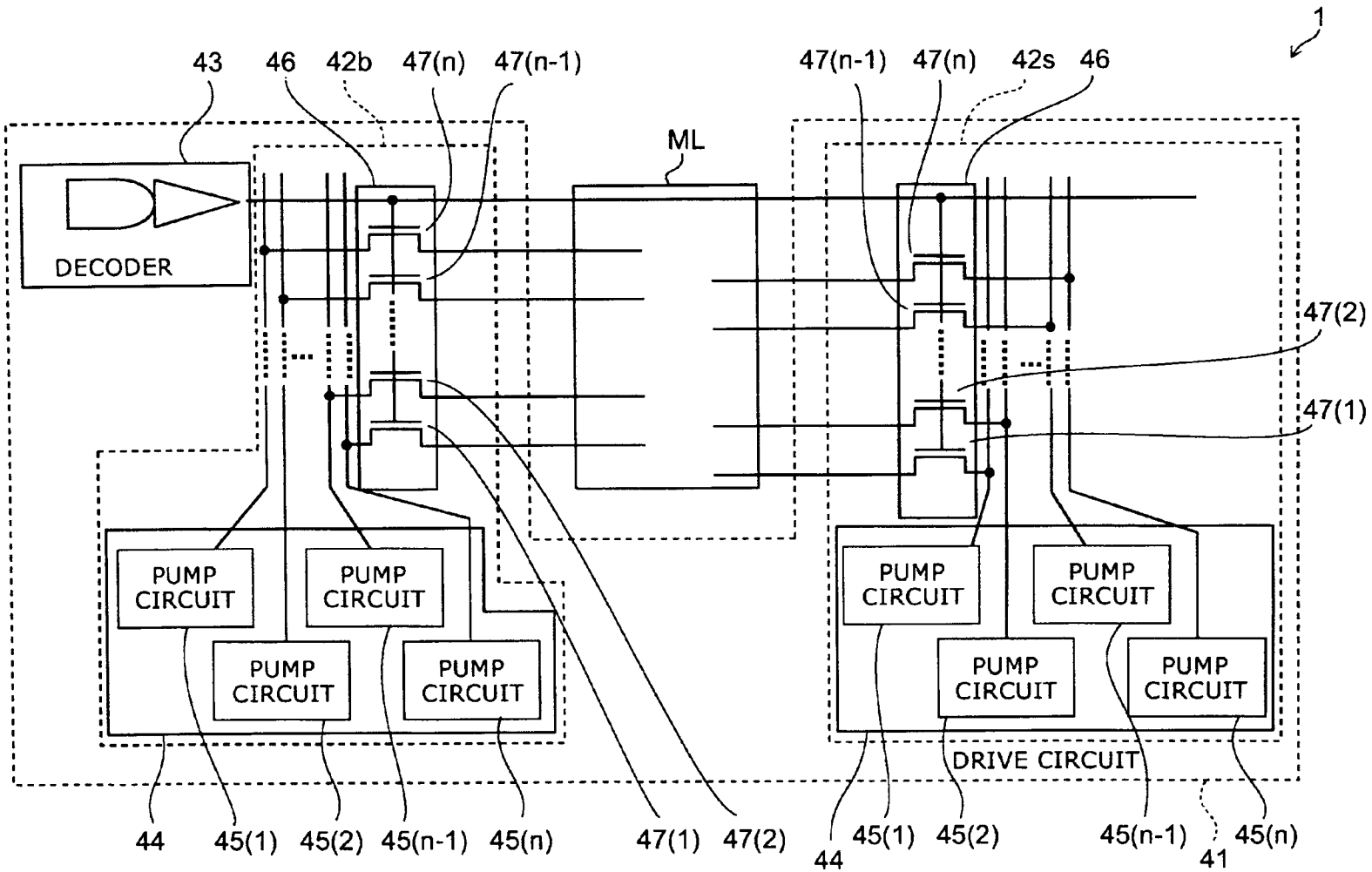
FIG. 6 is a circuit diagram of a drive circuit of the nonvolatile semiconductor memory device according to the first embodiment.

FIG. 6 is a circuit diagram illustrating a drive circuit of the nonvolatile semiconductor memory device according to this embodiment.

For easier viewing of the drawings in FIG. 1 and FIG. 2, only the conductive portions are illustrated, and the insulating portions are omitted. This is similar for FIG. 10 described below. For convenience of illustration in FIG. 2, the silicon pillars are illustrated with the same thickness regardless of the Z-direction position.

First, distinctive portions of this embodiment will be summarily described.

As illustrated in FIG. 1, a feature of a nonvolatile semiconductor memory device 1 according to this embodiment is that a drive circuit 41 supplying a driving potential to a control gate electrode CG applies the driving potential to reduce the potential difference with a silicon pillar 31 as a diameter of a through-hole piercing the control gate electrode CG decreases in a collectively patterned three-dimensionally stacked memory device in which memory transistors are provided at intersections between the silicon pillar 31 and the control gate electrodes CG. More specifically, in the nonvolatile semiconductor memory device 1, the diameter of the through-hole in which the silicon pillar 31 is buried decreases as the control gate electrode CG is disposed in a lower level. Therefore, the drive circuit 41 applies a lower driving potential to the control gate electrode CG disposed in a lower level.

The configuration of the nonvolatile semiconductor memory device will now be described in detail.

As illustrated in FIG. 2 and FIG. 3, a silicon substrate 11 is provided in the nonvolatile semiconductor memory device 1 (hereinbelow, also referred to as "the device 1") according to this embodiment. A memory cell region, in which memory cells are formed, and a peripheral circuit region (not illustrated), in which a drive circuit is formed, are set in the silicon substrate 11. The peripheral circuit region is disposed around the memory cell region.

First, the memory cell region will be described.

A feature of the memory cell region is that a stacked body ML, in which memory cells are arranged three-dimensionally, is provided. The diameter of a through-hole 21 piercing the stacked body ML becomes finer downward. The configuration of the memory cell region will now be described in detail.

An insulating film 10 is provided on the silicon substrate 11 in the memory cell region. Thereupon, a conductive film, e.g., a polysilicon film 12, is formed to form a back gate BG. Multiple electrode films 14 are alternately stacked with multiple insulating films 15 on the back gate BG; and the stacked body ML is formed.

For convenience of description in the specification, an XYZ orthogonal coordinate system will now be introduced. In this coordinate system, two mutually orthogonal directions parallel to an upper face of the silicon substrate 11 are taken as an X direction and a Y direction. A direction orthogonal to both the X direction and the Y direction, that is, the stacking direction of each layer, is taken as a Z direction.

The electrode film 14 is formed of, for example, polysilicon. In an X-direction central portion of the stacked body ML, the electrode film 14 is divided along the Y direction to form multiple control gate electrodes CG aligned in the X direction. Each layer of the electrode films 14 is patterned into the same pattern as viewed from above, i.e., the Z direction. As described below, at both X-direction end portions of the stacked body ML, the electrode film 14 is not divided along the Y direction to form one pair of comb-shaped configurations. On the other hand, the insulating films 15 are made of, for example, silicon oxide ($SiO_2$) and function as inter-layer insulating films to insulate the electrode films 14 from each other.

An insulating film 16, a conductive film 17 and an insulating film 18 are formed in this order on the stacked body ML. The conductive film 17 is made of, for example, polysilicon, is divided along the Y direction, and forms multiple selection gate electrodes SG aligned in the X direction. Two selection gate electrodes SG are provided in the region directly above each of the control gate electrodes CG of the uppermost layer. That is, although the selection gate electrode SG is aligned in the same direction (the X direction) as the control gate electrode CG, the arrangement period is half. As described below, the selection gate electrodes SG include a selection gate electrode SGb on the bit line side and a selection gate electrode SGs on the source line side.

An insulating film 19 is provided on the insulating film 18. A source line SL is provided on the insulating film 19 to align in the X direction. The source line SL is disposed in a region directly above every other one of the control gate electrodes CG of the uppermost layer arranged along the Y direction. An insulating film 20 is provided on the insulating film 19 to cover the source line SL. Multiple bit lines BL are provided on the insulating film 20 to align in the Y direction. Each of the source lines SL and the bit lines BL are formed of a metal film.

Multiple through-holes 21 are aligned in the stacking direction (the Z direction) of each of the layers to pierce the stacked body ML. The configuration of the through-hole 21 is, for example, circular as viewed from the Z direction. On the other hand, the side face of the through-hole 21 inclines with respect to the perpendicular direction; and the through-hole 21 becomes finer downward. Each of the through-holes 21 pierces the control gate electrode CG of each of the levels; and the lower end reaches the back gate BG. The through-holes 21 are arranged in a matrix configuration along the X direction and the Y direction. Because the control gate electrode CG is aligned in the X direction, multiple through-holes 21 arranged in the X direction pierce the same control gate electrode CG. The arrangement period of the through-holes 21 in the Y direction is half the arrangement period of the control gate electrodes CG. Thereby, two of the through-holes 21 arranged in the Y direction form one set; and the through-holes 21 belonging to the same set pierce the same control gate electrode CG.

A communicating hole 22 is made in an upper layer portion of the back gate BG so that the lower end portion of one through-hole 21 communicates with the lower end portion of one other through-hole 21 distal one row in the Y direction as viewed from the one through-hole 21. Thereby, one continuous U-shaped hole 23 is made of one pair of the through-holes 21 adjacent to each other in the Y direction and the communicating hole 22 communicating between the pair. Multiple U-shaped holes 23 are made in the stacked body ML.

An ONO (Oxide Nitride Oxide) film 24 is provided on an inner face of the U-shaped hole 23 via a barrier film (not illustrated) made of, for example, silicon nitride. In the ONO film 24, an insulative blocking film 25, a charge storage film 26, and an insulative tunneling film 27 are stacked in order from the outside. The blocking film 25 is a film in which current substantially does not flow even when a voltage in the range of the drive voltage of the device 1 is applied and is formed of, for example, a high dielectric constant material having a dielectric constant higher than the dielectric constant of the material forming the charge storage film 26, e.g., silicon oxide. The charge storage film 26 is a film capable of trapping charge and is formed of, for example, silicon nitride. Although the tunneling film 27 normally is insulative, the tunneling film 27 is a film in which a tunneling current flows when a prescribed voltage in the range of the drive voltage of the device 1 is applied and is formed of, for example, silicon oxide. The film thickness of the ONO film 24 is substantially uniform over the entire region on the inner face of the U-shaped hole 23.

A semiconductor material doped with an impurity, e.g., polysilicon, is filled into the interior of the U-shaped hole 23. Thereby, a U-shaped silicon member 33 is provided in the interior of the U-shaped hole 23. The portion of the U-shaped silicon member 33 positioned in the through-hole 21 forms the silicon pillar 31; and the portion positioned in the communicating hole 22 forms a connection member 32. The silicon pillar 31 has a columnar configuration, e.g., a circular columnar configuration, aligned in the Z direction. However, as described above, the diameter of the through-hole 21 becomes finer downward. Therefore, the diameter of the silicon pillar 31 filled into the interior thereof also becomes finer downward. The connection member 32 has a columnar configuration, e.g., a quadrilateral columnar configuration, aligned in the Y direction. Two of the silicon pillars 31 and one of the connection members 32 are formed integrally to form the U-shaped silicon member 33. Accordingly, the U-shaped silicon member 33 is formed continuously without breaks along the longitudinal direction thereof. The U-shaped silicon member 33 is insulated from the back gate BG and the control gate electrode CG by the ONO film 24.

Multiple through-holes 51 are made in the insulating film 16, the selection gate electrode SG, and the insulating film 18. Each of the through-holes 51 is made in a region directly above each of the through-holes 21 to communicate with each of the through-holes 21. Here, because the selection gate electrode SG is aligned in the X direction, the through-holes 51 arranged in the X direction pierce the same selection gate electrode SG. The arrangement period of the through-hole 51 in the Y direction is the same as the arrangement period of the selection gate electrode SG with the same arrangement phase. Accordingly, one of the multiple through-holes 51 arranged in the Y direction corresponds to one of the selection gate electrodes SG; and the multiple through-holes 51 pierce mutually different selection gate electrodes SG.

A gate insulating film 28 is formed on the inner face of the through-hole 51. Polysilicon, for example, is filled into the interior of the through-hole 51 to form a silicon pillar 34. The silicon pillar 34 has a columnar configuration, e.g., a circular columnar configuration, aligned in the Z direction. The lower end portion of the silicon pillar 34 is connected to the upper end portion of the silicon pillar 31 formed in a region directly therebelow. The silicon pillar 34 is insulated from the selection gate electrode SG by the gate insulating film 28. A U-shaped pillar 30 is formed of the U-shaped silicon member 33 and the pair of silicon pillars 34 connected to the upper end portions thereof.

The positional relationship among the U-shaped pillar 30, the control gate electrode CG, the selection gate electrode SG, the source line SL, and the bit line BL will now be described. One pair of the silicon pillars 34 and 31 adjacent in the Y direction is connected to each other by the connection member 32 to form the U-shaped pillar 30. On the other hand, the control gate electrode CG, the selection gate electrode SG, and the source line SL are aligned in the X direction; and the bit line BL is aligned in the Y direction. Although the arrangement periods of the U-shaped pillar 30 and the control gate electrode CG in the Y direction are the same, the phases are shifted one half-period. Therefore, one pair of the silicon pillars 31 belonging to each of the U-shaped pillars 30, i.e., the two silicon pillars 31 connected to each other by the connection member 32, pierces mutually different control gate electrodes CG. On the other hand, two silicon pillars 31 mutually adjacent in the Y direction and belonging to two U-shaped pillars 30 mutually adjacent in the Y direction pierce a common control gate electrode CG.

The multiple silicon pillars 34 arranged in the Y direction pierce mutually different selection gate electrodes SG. Accordingly, one pair of silicon pillars 34 belonging to each of the U-shaped pillars 30 pierces mutually different selection gate electrodes SG. On the other hand, the multiple U-shaped pillars 30 arranged in the X direction pierce a common pair of selection gate electrodes SG.

One silicon pillar 34 of the pair of silicon pillars 34 belonging to each of the U-shaped pillars 30 is connected to the source line SL via a source plug SP buried in the insulating film 19; and one other silicon pillar 34 of the pair is connected to the bit line BL via a bit plug BP buried in the insulating films 19 and 20. Accordingly, the U-shaped pillar 30 is connected between the bit line BL and the source line SL. In FIG. 1 to FIG. 4, the selection gate electrode SG pierced by the U-shaped pillar 30 and disposed on the bit line side is illustrated as the selection gate electrode SGb; and the selection gate electrode SG pierced by the U-shaped pillar 30 and disposed on the source line side is illustrated as the selection gate electrode SGs. The U-shaped pillars 30 arranged in the X direction are connected to a common source line SL and to mutually different bit lines BL. Here, the arrangement period of the U-shaped pillar 30 in the X direction is the same as the arrangement period of the bit line BL. Therefore, in the X direction, the U-shaped pillar 30 and the bit line BL correspond one-to-one. On the other hand, two of the U-shaped pillars 30 arranged in the Y direction are connected to each of the source lines SL as one set and are connected to a common bit line BL.

In the device 1 as illustrated in FIG. 1 to FIG. 4, the silicon pillar 31 functions as a channel and the control gate electrode CG functions as a gate electrode. Thereby, a vertical memory transistor 35 is formed at the intersection between the silicon pillar 31 and the control gate electrode CG. Each of the memory transistors 35 functions as a memory cell by the charge storage film 26 disposed between the silicon pillar 31 and the control gate electrode CG storing electrons. In the stacked body ML, the multiple silicon pillars 31 are arranged in a matrix configuration along the X direction and the Y direction. Therefore, the multiple memory transistors 35 are arranged three-dimensionally along the X direction, the Y direction, and the Z direction.

A selection transistor 36 is formed at the intersection between the silicon pillar 34 and the selection gate electrode SG with the silicon pillar 34 as the channel, the selection gate electrode SG as the gate electrode, and the gate insulating film 28 as the gate insulating film. The selection transistor 36 is a vertical transistor similar to the memory transistor 35 described above.

Also, because the ONO film 24 is interposed between the connection member 32 and the back gate BG, a back gate transistor 37 is formed with the connection member 32 as the channel, the back gate BG as the gate electrode, and the ONO film 24 as the gate insulating film. In other words, the back gate BG functions as an electrode to control the conducting state of the connection member 32 by an electric field.

As a result, as illustrated in FIG. 4, a memory string 38 connected between the bit line BL and the source line SL along each of the U-shaped pillars 30 is formed. In the memory string 38, the selection transistor 36 is provided at both end portions; the back gate transistor 37 is provided in the central portion; and the same number of memory transistors 35 as the number of stacks of the electrode films 14 is connected in series between the back gate transistor 37 and each of the selection transistors 36. In other words, the multiple memory transistors 35 arranged three-dimensionally in the stacked body ML may be collected as the memory string 38 for each of the U-shaped silicon members 33.

As illustrated in FIG. 5, the memory cell region of the device 1 is divided into multiple blocks 50. The positional relationship between the block 50 and each of the conductive members will now be described.

As illustrated in FIG. 5, the multiple blocks 50 set in the memory cell region are arranged along the Y direction. The conductive members provided in the device 1 to align in the X direction, i.e., the control gate electrode CG and the selection gate electrode SG, and the U-shaped pillar 30 aligned in the Z direction are organized into each of the blocks 50. The back gate BG formed along the XY plane is subdivided and mutually separated electrically from each other for each of the blocks 50. On the other hand, the bit line BL aligned in the Y direction extends to pass through all of the blocks 50 and is common to all of the blocks 50. An element separation film (not illustrated) is formed in a region of the silicon substrate 11 between the blocks 50.

The control gate electrodes CG belonging to each of the blocks 50 are organized further into two groups. In other words, the control gate electrodes CG are divided into the control gate electrode CG disposed in a region directly below the source line SL and pierced by the silicon pillar having an upper end portion connected to the source line SL (illustrated as a control gate electrode CGs in FIG. 5) and the control gate electrode CG disposed in a region outside of the region directly below the source line SL and pierced by a silicon pillar having an upper end portion connected to the bit line BL (illustrated as a control gate electrode CGb in FIG. 5). The control gate electrodes CGs and the control gate electrodes CGb are alternately arranged along the Y direction; the control gate electrodes CGs are commonly connected to each other; and the control gate electrodes CGb are commonly connected to each other. The control gate electrodes CGs are electrically separated from the control gate electrodes CGb.

Specifically, as illustrated in FIG. 5, the electrode films 14 (referring to FIG. 1) are not divided along the Y direction at both of the X-direction end portions of the stacked body ML; and incisions aligned in the X direction are made intermittently. Thereby, in each of the blocks 50, the electrode films 14 are subdivided into a pair of mutually meshed comb-shaped patterns to form the control gate electrodes CGs and the control gate electrodes CGb, respectively. Although the control gate electrode CGs has three comb teeth and the control gate electrode CGb has two comb teeth in FIG. 5 to simplify the drawing, this embodiment is not limited thereto, and the number of comb teeth may be higher.

The peripheral circuit region will now be described.

As illustrated in FIG. 6, the drive circuit 41 is provided in the peripheral circuit region to drive the memory string 38. The drive circuit 41 includes a potential supply unit 42b that applies a driving potential to the control gate electrode CGb of each of the levels formed in the stacked body ML and the selection gate electrode SGb, a potential supply unit 42s that applies a driving potential to the control gate electrode CGs of each of the levels and the selection gate electrode SGs, and a decoder 43 that outputs a control signal.

A pump circuit unit 44 is provided in the potential supply unit 42b. The pump circuit unit 44 includes n pump circuits 45(1) to 45(n), where n is the number of levels of the electrode films 14. Each of the pump circuits 45 is a circuit that increases the supplied voltage by a prescribed amount, where the voltage increase amount is different for each of the pump circuits.

A switch circuit unit 46 is provided in the potential supply unit 42b. The switch circuit unit 46 includes n switch elements 47(1) to 47(n). One end of a switch element 47(k) is connected to a pump circuit 45(k) and the other end is connected to the control gate electrode CGb of the kth level from the bottom of the stacked body ML, where k is an integer from 1 to n. Based on a control signal output by the decoder 43, the switch element 47(k) switches to connect or disconnect the pump circuit 45(k) and the control gate electrode CGb of the kth level from the bottom. For example, each of switch elements 47 is formed of a MOSFET; one of the source and drain is connected to the pump circuit 45; the other is connected to the control gate electrode CGb; and the gate is commonly connected to an output terminal of the decoder 43. Thereby, the pump circuit 45 is connected to the control gate electrode CGb only for the interval in which the decoder 43 outputs the prescribed control signal.

The configuration of the potential supply unit 42s also is similar to that of the potential supply unit 42b. In other words, the potential supply unit 42s also includes the pump circuit unit 44 and the switch circuit unit 46; and each of the switch elements 47 connect each of the pump circuits 45 to each of the control gate electrodes CGs based on a control signal output by the decoder 43.

Operations of the nonvolatile semiconductor memory device 1 according to this embodiment having the configuration described above will now be described.

FIG. 7 illustrates the potentials applied to the electrodes and the interconnections during operations of the nonvolatile semiconductor memory device according to this embodiment.

FIG. 8 illustrates the potentials applied to the control gate electrodes of each of the levels during operations of the non-volatile semiconductor memory device according to this embodiment.

Figure 9:
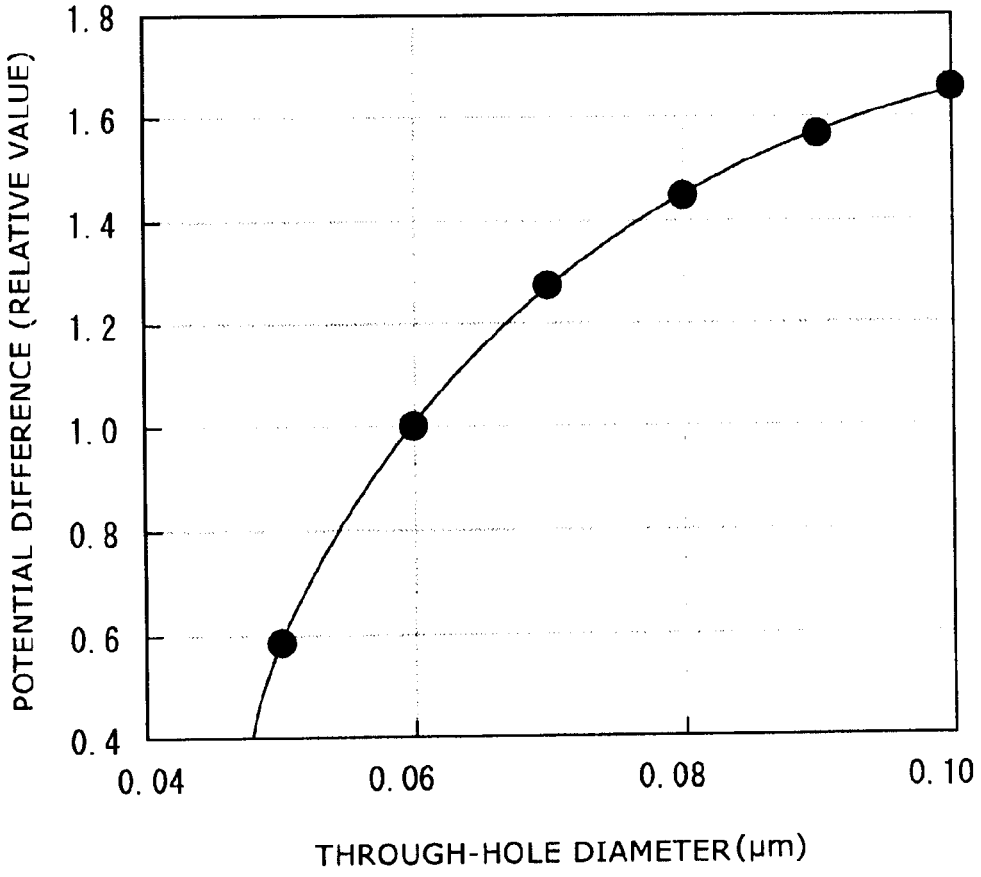
FIG. 9 is a graph of a method for determining a potential to be applied, where the diameter of a through-hole is plotted on the horizontal axis and the potential difference between a control gate electrode and a silicon pillar is plotted on the vertical axis.

FIG. 9 is a graph illustrating a method for determining the potential to be applied, where the diameter of the through-hole is plotted on the horizontal axis and the potential difference between the control gate electrode and the silicon pillar is plotted on the vertical axis.

In the following description, the memory transistor 35 is taken to be an n-channel field effect transistor. In the memory transistor 35, the state in which electrons are stored in the charge storage film 26 and the threshold value is shifted to positive is taken to be the value "0;" and the state in which electrons are not stored in the charge storage film 26 and the threshold value is not shifted is taken to be the value "1." The number of levels (n) of the control gate electrodes is taken to be 4. The memory transistor 35 (hereinbelow referred to as "selected cell") to and from which data is to be written and read is taken to be the memory transistor of the third level from the bottom of the silicon pillar having an upper end portion connected to the bit line BL. In other words, the control gate electrode CGb of the third level from the bottom is the gate electrode of the selected cell. Further, it is taken that in the initial state, electrons are not stored in any of the memory transistors 35. Accordingly, the value "1" is written thereto.

(Writing Operation)

First, writing operations to write any data to each of the memory transistors 35 will be described. The writing of the date is performed for one block at a time in order and is performed simultaneously for multiple selected cells arranged in the X direction. As illustrated in FIG. 2, although these multiple selected cells belong to mutually different memory strings 38, they share the same control gate electrode CG. Also, although the multiple memory strings 38 to which these selected cells belong are connected to mutually different bit lines BL, the multiple memory strings 38 pierce a common selection gate electrode SG and are connected to a common source line SL.

First, the Y coordinate of the memory strings 38 (hereinbelow referred to as "selected strings") of the memory transistors 35 to be written (the selected cells) is selected. Specifically, as illustrated in FIG. 7, the drive circuit 41 applies a selection gate potential $V_{sg}$ to the selection gate electrode SGb of the selected strings and applies an OFF potential $V_{off}$ to the selection gate electrode SGs. The drive circuit 41 applies the OFF potential $V_{off}$ to the selection gate electrodes SGb and SGs of the unselected memory strings 38. The OFF potential $V_{off}$ is a potential of the gate electrode of the transistor such that the transistor is switched to the OFF state, e.g., a reference potential Vss. The reference potential Vss is, for example, a grounding potential (0 V). The selection gate potential $V_{sg}$ is a potential of the selection gate electrode SG of the selection transistor 36 such that the conducting state of the selection transistor 36 is determined by the potential of the silicon pillar (the body potential), e.g., a potential higher than the reference potential Vss. The potential of the back gate BG is taken as an ON potential $V_{on}$. The ON potential $V_{on}$ is a potential of the gate electrode of the transistor such that the transistor is switched to the ON state, e.g., a power supply potential Vdd (e.g., 3.0 V).

Thereby, the selection transistors 36 on the bit line side of the selected strings are switched to the ON state and the OFF state by the potential of the bit lines BL; and the selection transistors 36 on the source line side are switched to the OFF state. All of the selection transistors 36 of the unselected memory strings 38 are switched to the OFF state. The back gate transistors 37 of all of the memory strings 38 are switched to the ON state.

Then, the reference potential Vss (e.g., 0 V) is applied to the bit lines BL connected to the selected cells to be written with the value "0;" and the power supply potential Vdd (e.g., 3.0 V) is applied to the bit lines BL connected to the selected cells to be written with the value "1." On the other hand, the power supply potential Vdd is applied to all of the source lines SL.

In this state, the positions of the selected cells of the selected strings are selected. Specifically, the drive circuit 41 increases the potential of the control gate electrode CG of the selected cells, e.g., the control gate electrodes CGb of the third layer from the bottom, to a writing potential $V_{pgm}$ (e.g., 18 V); and the potential of the other control gate electrodes CG, i.e., the control gate electrodes CGb of the layers other than the third layer from the bottom and all of the control gate electrodes CGs, are provided with an intermediate potential $V_{pass}$ (e.g., 10 V). At this time, because the control gate electrodes CGb of the third layer are connected to each other, the writing potential $V_{pgm}$ is applied to the control gate electrodes CGb of the third layer also for the unselected memory strings. The writing potential $V_{pgm}$ is a potential high enough to inject electrons from the silicon pillar 31 into the charge storage film 26 of the ONO film 24, and is a potential higher than the reference potential Vss and the selection gate potential $V_{sg}$. That is, $Vss<V_{sg}<V_{pgm}$. Although the intermediate potential $V_{pass}$ is a potential higher than the reference potential Vss, the intermediate potential $V_{pass}$ is a potential lower than the writing potential $V_{pgm}$. That is, $Vss<V_{pass}<V_{pgm}$. However, as described below, the value of the writing potential $V_{pgm}$ differs by the level where the control gate electrode CG to which the potential is to be applied is disposed.

Thereby, for the selected cells to be written with the value "0," the potential difference between the source potential and the gate potential of the selection transistors 36 on the bit line side exceeds the threshold and the selection transistors 36 are switched to the ON state because the potential of the bit lines BL is the reference potential Vss (e.g., 0 V) and the potential of the selection gate electrodes SGb on the bit line side is the selection gate potential $V_{sg}$ which is higher than the reference potential Vss. As a result, a body potential $V_{body}$ of the selected cells approaches the reference potential Vss. The potential of the control gate electrodes CG of the selected cells is the writing potential $V_{pgm}$ (e.g., 18 V). Accordingly, the difference ($V_{pgm}-V_{body}$) between the gate potential and the body potential of the selected cells is sufficiently large; high-temperature electrons are created by the potential difference; and the electrons are injected from the silicon pillar 31 into the charge storage film 26 via the tunneling layer 27. Thereby, the value "0" is written into the selected cells.

On the other hand, for the selected cells to be written with the value "1," the potential of the bit lines BL is the positive potential Vdd (e.g., 3.0 V) and the potential of the selection gate electrode SGb on the bit line side is the selection gate potential $V_{sg}$ which is higher than the reference potential Vss. Therefore, the potential difference between the source potential and the gate potential of the selection transistors 36 on the bit line side is small, and the selection transistors 36 are switched to the OFF state by a back gate effect. Thereby, the silicon pillars 31 are in a floating state and the body potential $V_{body}$ of the selected cells is maintained at a high value by coupling with the control gate electrodes CG provided with the intermediate potential $V_{pass}$ (e.g., 10 V). Therefore, the difference ($V_{pgm}-V_{body}$) between the writing potential $V_{pgm}$ (e.g., 18 V) of the control gate electrode CG of the selected cells and the body potential $V_{body}$ decreases, and electrons are not injected into the charge storage film 26. As a result, the value "1" is written into the selected cells.

For the unselected memory strings 38, the potential of the silicon pillars 31 is in the floating state because the selection transistors 36 at both of the end portions are switched to the OFF state. In such a case, the body potential $V_{body}$ of the silicon pillars 31 can be controlled by the potential applied to the control gate electrodes CG, the voltage increase rate thereof, and the potential of the selection gate electrodes SG; and a high potential can be maintained. As a result, the difference ($V_{pgm}-V_{body}$) between the gate potential and the body potential of the memory transistors 35 decreases, electrons are not injected into the charge storage film 26, and the initial value is maintained.

Thus, in this embodiment, the writing row (the Y coordinate) is selected by controlling the conducting state of the selection transistors, and data is written to the memory strings 38 arranged in the X direction in order by row. At this time, the potential of the control gate electrodes is controlled by block. Therefore, for the writing disturbance, it is sufficient to consider the total time necessary for writing the data to the memory strings in the block. Thereby, the disturbance time can be controlled by adjusting the block size.

Because multiple pump circuits 45 are provided in the drive circuit 41 in this embodiment as illustrated in FIG. 6, potentials having multiple levels can be generated as the writing potential $V_{pgm}$ as illustrated in FIG. 8. The writing potentials $V_{pgm}$ generated by each of the pump circuits 45 can be applied to the control gate electrodes CG of each of the levels by each of the switch elements 47 of the switch circuit unit 46 connecting each of the pump circuits 45 to the control gate electrodes CG of each of the levels based on the control signal output by the decoder 43. Thus, the values of the writing potential $V_{pgm}$ can differ by the level where the control gate electrode CG to which the potential is to be applied is disposed.

In other words, as illustrated in FIG. 8, the value of the writing potential $V_{pgm}$ applied to a control gate electrode CG4 of the uppermost level, that is, the 4th level from the bottom, is set to be ($V_{pgm}$0); the value of the writing potential $V_{pgm}$ applied to a control gate electrode CG3 of the third level from the bottom is set to be ($V_{pgm}$0$-\Delta V_{pgm}$1) which is lower than ($V_{pgm}$0); the value of the writing potential $V_{pgm}$ applied to a control gate electrode CG2 of the 2nd level from the bottom is set to be ($V_{pgm}$0$-\Delta V_{pgm}$2) which is lower than ($V_{pgm}$0$-\Delta V_{pgm}$1); and the value of the writing potential $V_{pgm}$ applied to a control gate electrode CG1 of the lowermost level is set to be ($V_{pgm}$0$-\Delta V_{pgm}$3) which is lower than ($V_{pgm}$0$-\Delta V_{pgm}$2). Here, $0<\Delta V_{pgm}1<\Delta V_{pgm}2<\Delta V_{pgm}3$.

Supposing that the values of the potentials applied to the control gate electrodes CG are the same, the intensity of the electric field applied to the tunneling film 27 increases as the surface area ratio of the inner surface and the outer surface of the charge storage film 26 increases. Therefore, the intensity of the electric field applied to the tunneling film 27 increases as the diameter of the through-hole 21 decreases. Thereby, an electron current due to tunneling may undesirably flow into the tunneling film 27 of the memory transistor 35 to which the value of "0" is to be written; and a miswrite (a program disturbance) may occur in which the mistaken value of "1" is undesirably written. Moreover, even in the case where such a miswrite does not occur, the amount of electrons injected from the silicon pillar 31 into the charge storage film 26 may increase for a memory transistor having a small through-hole 21 diameter; and the amount of charge injected into the charge storage film 26 undesirably becomes non-uniform.

Therefore, in this embodiment as described above, a writing potential $V_{pgm}$ having a lower potential is applied in memory transistors positioned lower and having smaller through-hole 21 diameters. At this time, the body potential $V_{body}$ of the silicon pillar 31 is a potential near the reference potential Vss. Therefore, the potential difference ($V_{pgm}-V_{body}$) between the control gate electrode CG and the silicon pillar 31 decreases as the memory transistor is disposed lower. Also, the electric field applied to the tunneling film 27 decreases as the potential difference ($V_{pgm}-V_{body}$) decreases.

Thus, in this embodiment, the drive circuit 41 applies the writing potential $V_{pgm}$ that is lower as the control gate electrode CG is disposed lower. Thereby, the increase of the electric field intensity caused by smaller through-hole 21 diameters is canceled; and a more uniform electric field intensity can be applied to the tunneling film 27. As a result, miswriting (program disturbances) does not occur easily even for the memory transistors 35 disposed lower and having smaller through-hole 21 diameters. Further, the amount of electrons injected into the charge storage films 26 of the memory transistors 35 during one writing operation can be uniform; and the driving of the memory transistors can be stabilized. Because the amount of the injected electrons is made to be uniform, the writing operation duration of the memory transistors 35 also can be uniform. Thereby, the writing operation duration of the entire device 1 can be reduced; and the operation speed can be increased.

A method for determining the value of the writing potential $V_{pgm}$ will now be described. As illustrated in FIG. 9, the intensity of the electric field applied to the tunneling film 27 in one memory transistor can be uniform by determining the value of the writing potential $V_{pgm}$ such that a potential difference V follows Formula 1 recited below, where r (μm) is the diameter of the through-hole 21 of the one memory transistor and V is the potential difference ($V_{pgm}-V_{body}$) between the control gate electrode CG and the silicon pillar 31. The value of the potential difference V illustrated in Formula 1 and FIG. 9 herein is a relative value such that the value of the potential difference V (i.e., $V_{pgm}-V_{body}$) is 1 when the diameter of the through-hole 21 is 0.06 μm (60 nm). Formula 1 recited below provides an effective approximation at least for values of r in the range of 0.05 to 0.1 μm.

$$V=6999.4\times r^3-1971.3\times r^2+194.66\times r-5.0952 \quad \text{Formula 1}$$

(Reading Operation)

A reading operation in which the data written to any of the memory transistors 35 is read will now be described. As illustrated in FIG. 7, the drive circuit 41 applies the ON potential $V_{on}$ to the back gate BG, and the back gate transistors 37 are switched to the ON state. The drive circuit 41 applies the ON potential $V_{on}$ (e.g., 3.0 V) to the selection gate electrodes SGs and SGb of the selected strings, and the selection transistors 36 are switched to the ON state. On the other hand, the drive circuit 41 applies the OFF potential $V_{off}$ (e.g., 0 V) to the selection gate electrodes SGs and SGb of the unselected memory strings 38, and the selection transistors 36 are switched to the OFF state.

The drive circuit 41 applies a potential to the control gate electrode CG of the selected cells, i.e., the control gate electrode CGb of the third layer from the bottom, such that the conducting state differs due to the value of the selected cells. The potential is, for example, the reference potential Vss (e.g., 0 V) and is a potential such that a current does not flow in the body in the case where the value of the selected cell is "0," i.e., when electrons are stored in the charge storage film 26 and the threshold is shifted to positive, and a current flows in the body in the case where the value of the selected cell is "1," i.e., when electrons are not stored in the charge storage film 26 and the threshold is not shifted. For the memory transistors 35 other than those of the selected cells, a reading potential $V_{read}$ (e.g., 4.5 V) is applied to the control gate electrodes thereof such that the memory transistors 35 are switched to the ON state regardless of the values thereof.

In this state, a potential Vb1 (e.g., 0.7 V) is applied to each of the bit lines BL, and the reference potential Vss (e.g., 0 V) is applied to each of the source lines SL. As a result, a current flows in the selected string if the value of the selected cell is "1" and a current does not flow in the selected string if the value of the selected cell is "0." Accordingly, the value of the selected cell can be read by detecting the current flowing in the source line SL from the bit line BL via the selected string or by detecting the potential drop of the bit line BL. For example, because the potential of the bit line BL changes when the value of the selected cell is "1," the change is amplified by a bit line amplifier circuit (not illustrated) and detected; and the detection result is stored as data in a data buffer (not illustrated). For the unselected memory strings 38, a current does not flow regardless of the values stored in the memory transistors 35 because the selection transistors 36 are in the OFF state.

In this embodiment, the drive circuit 41 varies the value of the reading potential $V_{read}$ by the level where the control gate electrode CG to which the potential is to be applied is disposed using the pump circuit 45. In other words, as illustrated in FIG. 8, the value of the reading potential $V_{read}$ applied to the control gate electrode CG4 of the uppermost level, i.e., the 4th level from the bottom, is set to be ($V_{read}$0); the value of the reading potential $V_{read}$ applied to the control gate electrode CG3 of the third level from the bottom is set to be ($V_{read}$0−$\Delta V_{read}$1) which is lower than ($V_{read}$0); the value of the reading potential $V_{read}$ applied to the control gate electrode CG2 of the 2nd level from the bottom is set to be ($V_{read}$0=$\Delta V_{read}$2) which is lower than ($V_{read}$0−$\Delta V_{read}$1); and the value of the reading potential $V_{read}$ applied to the control gate electrode CG1 of the lowermost level is set to be ($V_{read}$0−$\Delta V_{read}$3) which is lower than ($V_{read}$0−$\Delta V_{read}$2). Here, $0<\Delta V_{read}1<\Delta V_{read}2<\Delta V_{read}3$.

As described above, supposing that the same potential is applied to each of the control gate electrodes CG, the intensity of the electric field applied to the tunneling film 27 of each of the memory transistors increases as the through-hole 21 diameter decreases. In the case where the electric field applied to the tunneling film 27 during the reading operation is too strong, electron current undesirably flows in the tunneling film 27 due to tunneling; and a phenomenon (read disturbance) occurs in which the value "0" written to the memory transistor undesirably changes to the value "1."

Therefore, in this embodiment as described above, the reading potential $V_{read}$ has a lower potential as the control gate electrode CG is positioned lower with a smaller through-hole 21 diameter. Thereby, the increase of the electric field intensity caused by smaller through-hole 21 diameters is canceled by reducing the reading potential $V_{read}$; and the electric field intensity applied to the tunneling film 27 is made to be uniform. As a result, read disturbance of the memory transistor can be prevented. It is favorable for the value of the reading potential $V_{read}$ to be determined according to Formula 1 recited above for reasons similar to those of the case of the writing operation described above.

(Erasing Operation)

An erasing operation in which data written to the memory transistor is erased will now be described. The unit of erasing data is by block. As illustrated in FIG. 7, the drive circuit 41 applies the ON potential $V_{on}$ to the back gate BG, and the back gate transistors 37 are switched to the ON state. The reference potential Vss (e.g., 0 V) is applied to all of the control gate electrodes CG of the block to be erased (hereinbelow referred to as "selected block"). The potentials of the bit lines BL and the source lines SL are increased to an erasing potential $V_{erase}$ (e.g., 15 V). Also, the selection gate potential $V_{sg}$ which is lower than the erasing potential $V_{erase}$ is applied to the selection gate electrodes SGb and SGs. That is, $V_{sg}<V_{erase}$.

Thereby, the potential of the bit lines BL and the source lines SL is the erasing potential $V_{erase}$ (e.g., 15 V), and the potential of the selection gate electrodes SGb and SGs is the selection gate potential $V_{sg}$. Therefore, a hole current is produced by tunneling between bands due to the potential difference between the bit lines BL and the selection gate electrodes SGb and the potential difference between the source lines SL and the selection gate electrodes SGs; and the potential of the silicon pillars 31, i.e., the body potential, increases. On the other hand, the reference potential Vss (e.g., 0 V) is applied to the control gate electrodes CG of the block to be erased (the selected block). Therefore, holes are injected into the charge storage films 26 of the memory transistors 35 due to the potential difference between the silicon pillars 31 and the control gate electrodes CG, and electrons in the charge storage film 26 undergo pair annihilation. As a result, the data is erased. Although it is necessary to provide a potential difference between the erasing potential $V_{erase}$ and the selection gate potential $V_{sg}$ sufficient to inject sufficient holes into the charge storage film 26 because the body potential increases due to the injection of the hole current, it is simultaneously necessary to adjust such that the gate insulating film 28 of the selection transistor 36 is not destructed by an excessive potential difference.

On the other hand, for the blocks not to be erased (the unselected blocks), the potential of the selection gate electrodes SGb and SGs is increased to a potential approaching the potential of the bit lines BL and the source lines SL, and the electric field between a diffusion layer connected to the bit lines BL or the source lines SL and the selection gate electrodes SGb or SGs is reduced so that a hole current is not produced. Or, the potential of the control gate electrodes CG is increased simultaneously with that of the silicon pillars 31 so that holes in the silicon pillars 31 are not injected into the charge storage films 26. Thereby, the values already written to the memory transistors 35 of the unselected blocks are maintained as-is.

In the erasing operation as well, when the drive circuit 41 supplies a higher potential as the reference potential Vss as the control gate electrode CG is disposed lower, the potential difference between the silicon pillar 31 and the control gate electrode CG decreases as the memory transistor is disposed lower; and the electric field applied to the ONO film 24 can be uniform. Thereby, the application of an excessive electric field to the memory transistors having small through-hole diameters and the injection of electrons from the control gate electrode CG into the charge storage film 26 due to tunneling during the erasing operation can be prevented. As a result, the undesirable cancellation of the injection of the holes necessary for the erasing operation, that is, the hole injection from the silicon pillar 31 toward the charge storage film 26, by the reverse injection of electrons from the control gate electrode CG toward the charge storage film 26 is prevented; and the erasing operation can be implemented reliably.

Effects of this embodiment will now be described.

According to this embodiment as described above, the drive circuit 41 includes the multiple pump circuits 45; and each of the pump circuits 45 is connected to the control gate electrodes CG of each of the levels via each of the switch elements 47. Thereby, mutually different driving potentials can be applied to the control gate electrodes CG of each of the levels. Thereby, the potential difference between the control gate electrode CG and the silicon pillar 31 can be reduced as the memory transistor is positioned lower and has a smaller through-hole 21 diameter; and the electric field intensity applied to the ONO films 24 of the memory transistors can be uniform. As a result, misoperation of the memory transistor can be prevented. Great effects can be obtained by applying such technology to at least one operation selected from the writing operation, the reading operation, and the erasing operation when supplying the potential to the control gate electrode to provide the greatest potential difference with the silicon pillar of the operation.

A second embodiment will now be described.

Figure 10:
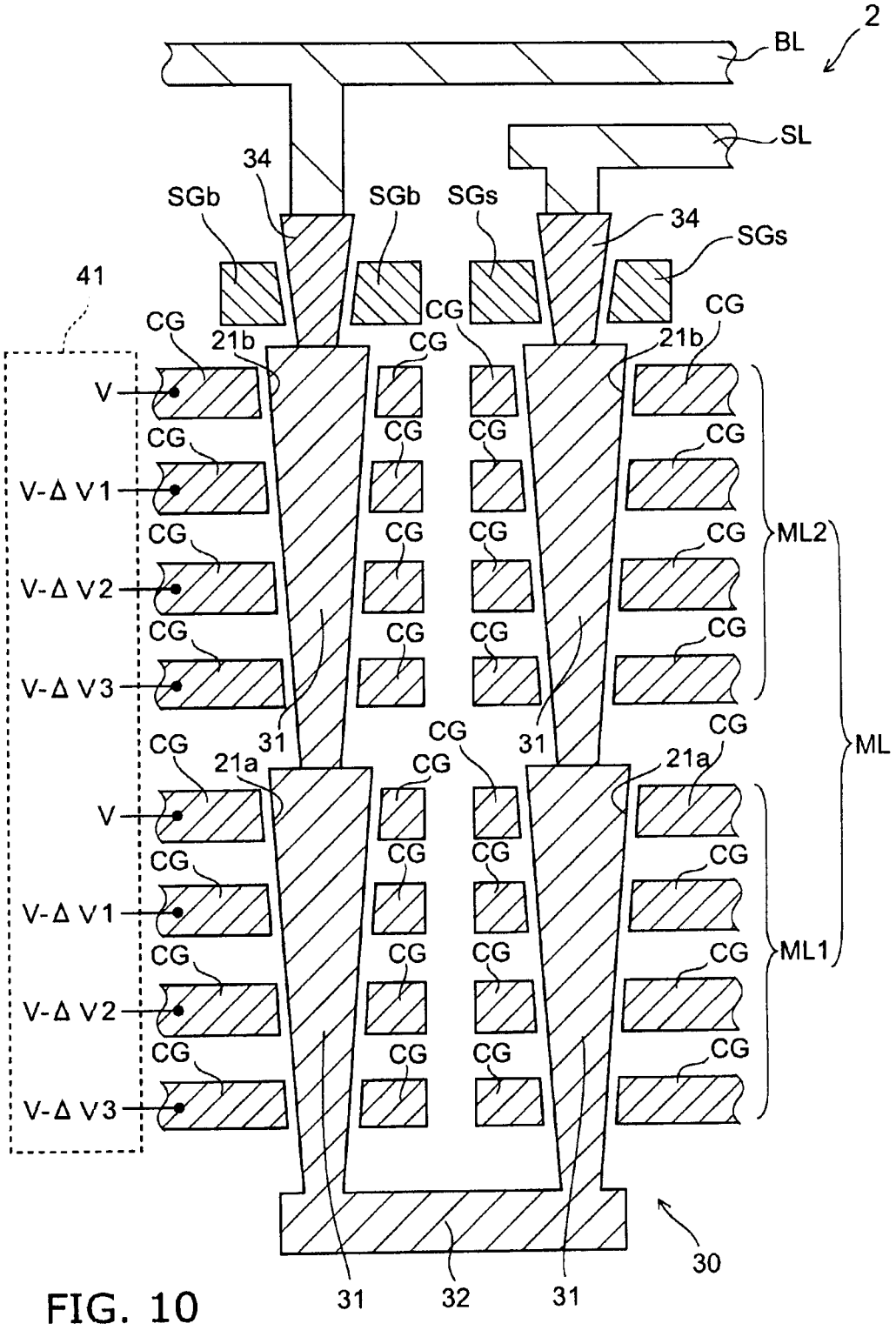
FIG. 10 a diagram of features of a nonvolatile semiconductor memory device according to a second embodiment.

FIG. 10 schematically illustrates features of a nonvolatile semiconductor memory device according to this embodiment.

In this embodiment as illustrated in FIG. 10, the through-hole has a two-level configuration. In each level, the through-hole becomes finer downward. In other words, the stacked body ML is made of two partial stacked bodies ML1 and ML2 arranged in the Z direction; and the partial stacked body ML2 is stacked on the partial stacked body ML1. Multiple insulating films 15 and multiple electrode films 14 are stacked in each of the partial stacked bodies ML1 and ML2. Each of a lower portion 21a of the through-hole 21 made in the partial stacked body ML1 and an upper portion 21b made in the partial stacked body ML2 have a tapered configuration that becomes finer downward. Therefore, the upper end portion of the lower portion 21a is wider than the lower end portion of the upper portion 21b; and a step is formed in the inner face of the through-hole 21 at the boundary portion between the lower portion 21a and the upper portion 21b.

The drive circuit 41 applies potentials to the multiple electrode films 14 disposed in the partial stacked body ML1 such that the potential difference with the silicon pillar 31 decreases as the electrode film 14 is disposed lower, that is, toward the silicon substrate 11 side. Similarly, the drive circuit 41 applies potentials to the multiple electrode films 14 disposed in the partial stacked body ML2 such that the potential difference with the silicon pillar 31 decreases as the electrode film 14 is disposed lower. Thereby, in this embodiment as well, the fluctuation of the electric field intensity caused by the fluctuation of the through-hole 21 diameter can be compensated by varying the driving potential; and the electric field intensities applied to the ONO films 24 of the memory transistors 35 can be uniform. As a result, the misoperation of the memory transistor can be prevented. Otherwise, the configuration, operations, and effects of this embodiment are similar to those of the first embodiment described above.

Three or more levels of partial stacked bodies may be stacked. In such a case, it is sufficient for the drive circuit 41 to apply the potential to the electrode film 14 (the control gate electrode CG) disposed in each of the partial stacked bodies such that the potential difference with the silicon pillar 31 decreases as the electrode film is disposed lower.

A third embodiment of the invention will now be described.

This embodiment is an embodiment of a method for manufacturing the nonvolatile semiconductor memory device 1 according to the first embodiment described above.

FIG. 11 to FIG. 19 are cross-sectional views of processes, illustrating the method for manufacturing the nonvolatile semiconductor memory device according to this embodiment.

FIG. 11 to FIG. 19 illustrate the same cross section as that of FIG. 3.

Figure 11:
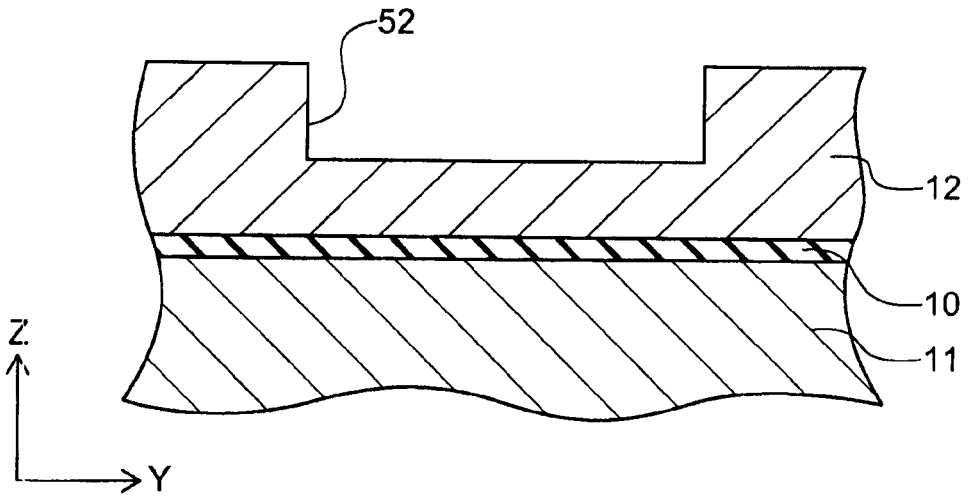
FIG. 11 is a cross-sectional view of processes of a method for manufacturing a nonvolatile semiconductor memory device according to a third embodiment.

First, as illustrated in FIG. 11, the silicon substrate 11 is prepared. A memory cell region is set in the silicon substrate 11. A peripheral circuit region (not illustrated) is set around the memory cell region. An element separation film is formed in a prescribed region of the upper layer portion of the silicon substrate 11. Then, a thick film gate insulating film for high breakdown voltage transistors and a thin film gate insulating film for low breakdown voltage transistors are made separately in the peripheral circuit region. At this time, the insulating film 10 is formed on the silicon substrate 11 also in the memory cell region.

Then, the polysilicon film 12 is deposited on the insulating film 10 as a conductive film with a thickness of, for example, 200 nm. Photolithography and RIE (Reactive Ion Etching) are performed on the upper layer portion of the polysilicon film 12 in the memory cell region to make multiple trenches 52 having rectangular configurations aligned in the Y direction on the upper face of the polysilicon film 12. The trenches 52 are arranged in a matrix configuration along the X direction and the Y direction. The trenches 52 are recesses made in the upper face of the polysilicon film 12.

Figure 12:
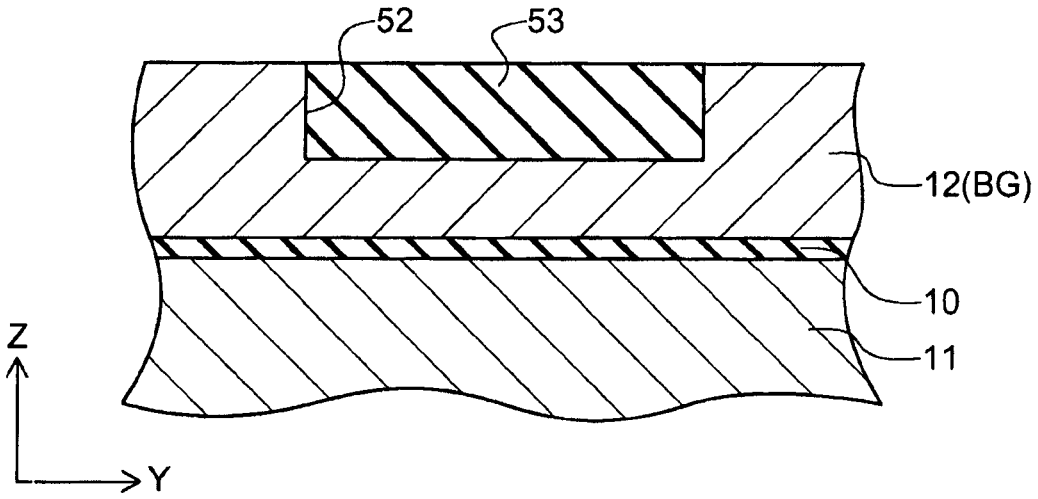
FIG. 12 is a cross-sectional view of processes of the method for manufacturing a nonvolatile semiconductor memory device according to the third embodiment.

Continuing as illustrated in FIG. 12, a silicon nitride film is deposited by, for example, CVD (Chemical Vapor Deposition) to form a sacrificial film 53 on the polysilicon film 12. At this time, the sacrificial film 53 also is filled into the trenches 52. Then, the sacrificial film 53 and the polysilicon film 12 are patterned by, for example, photolithography and RIE. Thereby, the polysilicon film 12 in the memory cell region is divided for every block 50 (referring to FIG. 5); the back gates BG made of the polysilicon film 12 are formed in flat-plate configurations in each of the blocks 50; and gate electrodes made of the polysilicon film 12 are formed in the peripheral circuit region.

Subsequently, a spacer made of silicon oxide is formed and a diffusion layer is formed by ion implantation in the peripheral circuit region. Then, an inter-layer insulating film is deposited in the peripheral circuit region, planarized, and recessed so that the upper face thereof is the same height as the upper face of the polysilicon film 12. Then, the sacrificial film 53 is recessed so that the sacrificial film 53 is removed from the polysilicon film 12 and left only in the interiors of the trenches 52.

Figure 13:
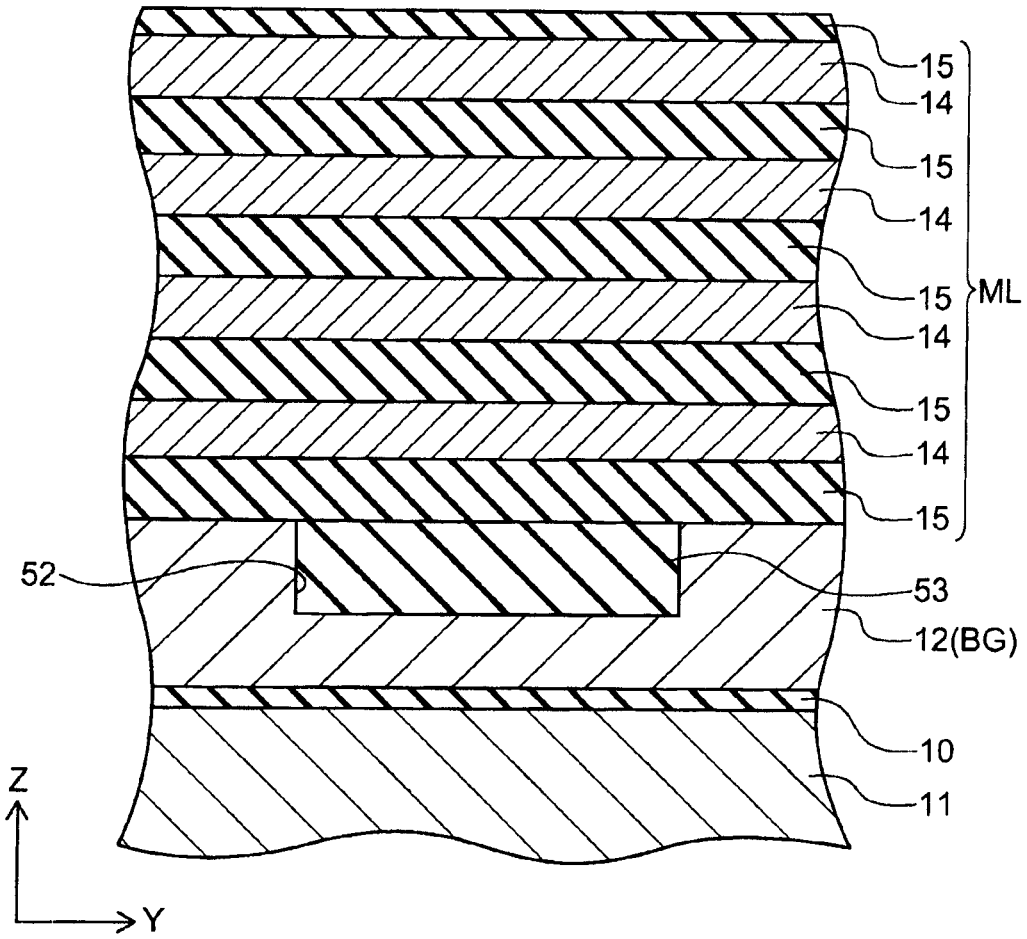
FIG. 13 is a cross-sectional view of processes of the method for manufacturing a nonvolatile semiconductor memory device according to the third embodiment.

Continuing as illustrated in FIG. 13, the insulating films 15 made of, for example, silicon oxide are deposited alternately with the electrode films 14 made of, for example, polysilicon on the back gate BG (the polysilicon film 12) in the memory cell region to form the stacked body ML.

Figure 14:
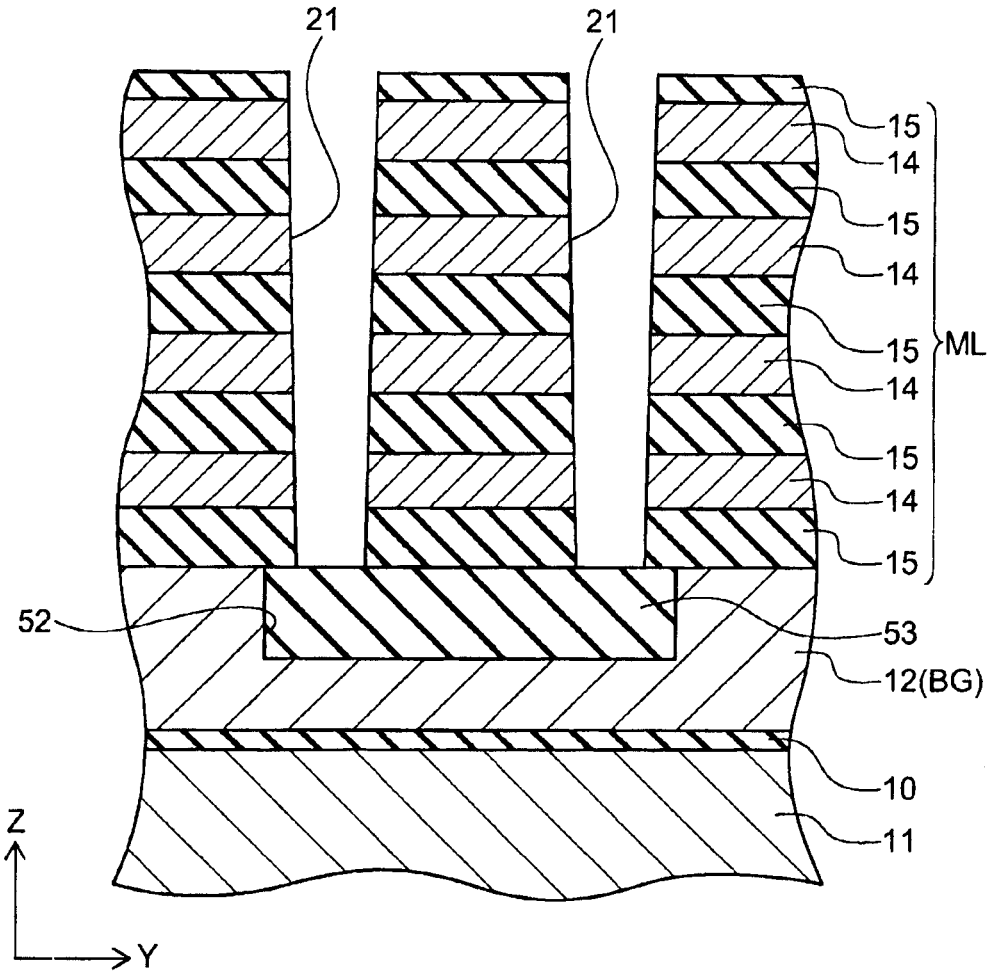
FIG. 14 is a cross-sectional view of processes of the method for manufacturing a nonvolatile semiconductor memory device according to the third embodiment.

Then, as illustrated in FIG. 14, the multiple through-holes 21 are collectively made in the stacked body ML by dry etching such as RIE to align in the Z direction. The through-holes 21 are arranged in a matrix configuration along the X direction and the Y direction. Also, the bottom portions of the through-holes 21 reach both end portions of the sacrificial films 53 filled into the trenches 52. Thereby, two through-holes 21 adjacent to each other in the Y direction reach each of the sacrificial films 53. The through-hole 21 has a circular configuration as viewed from the Z direction. At this time, the inner side face of the through-hole 21 unavoidably has a tapered configuration inclined with respect to the Z direction. As a result, the through-hole 21 is made in an inverted circular-conic trapezoidal configuration becoming finer downward such that the upper end portion is the widest.

Figure 15:
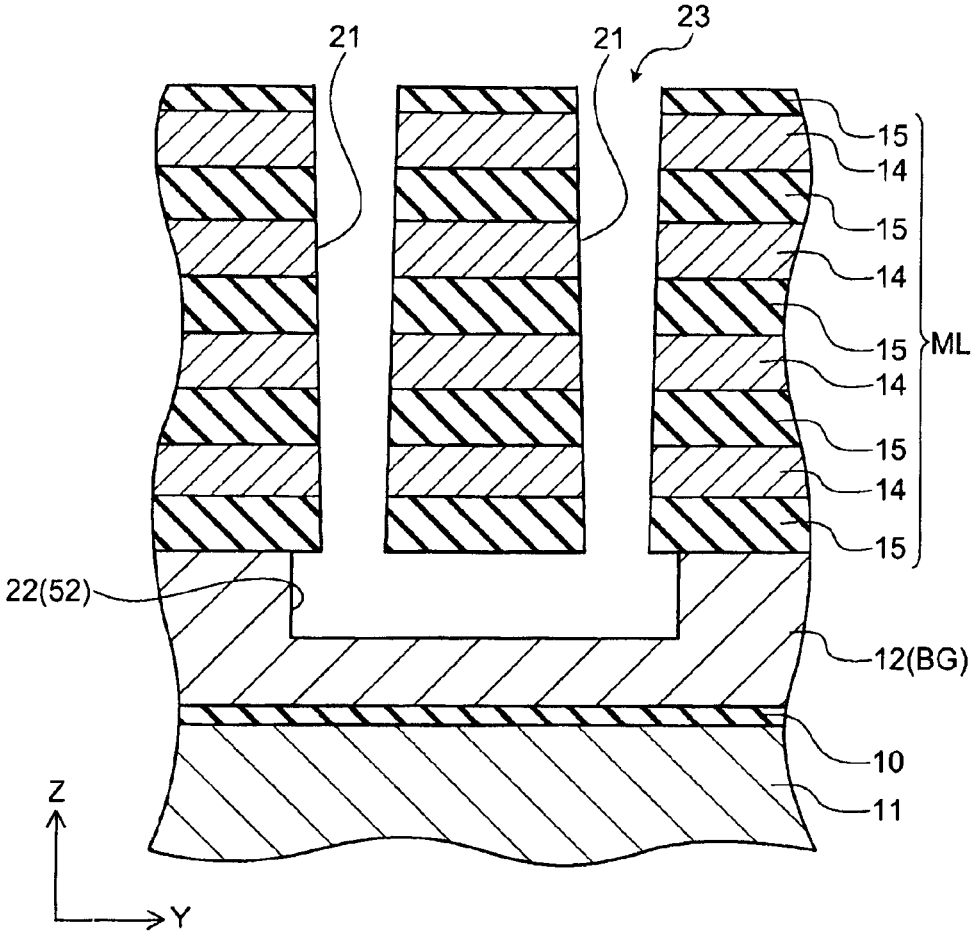
FIG. 15 is a cross-sectional view of processes of the method for manufacturing a nonvolatile semiconductor memory device according to the third embodiment.

Continuing as illustrated in FIG. 15, wet etching is performed via the through-holes 21 to remove the sacrificial film 53 (referring to FIG. 14) from the trenches 52. Thereby, the trench 52 becomes the communicating hole 22; and one continuous U-shaped hole 23 is formed of the communicating hole 22 and the two through-holes 21 communicating with both end portions thereof.

Figure 16:
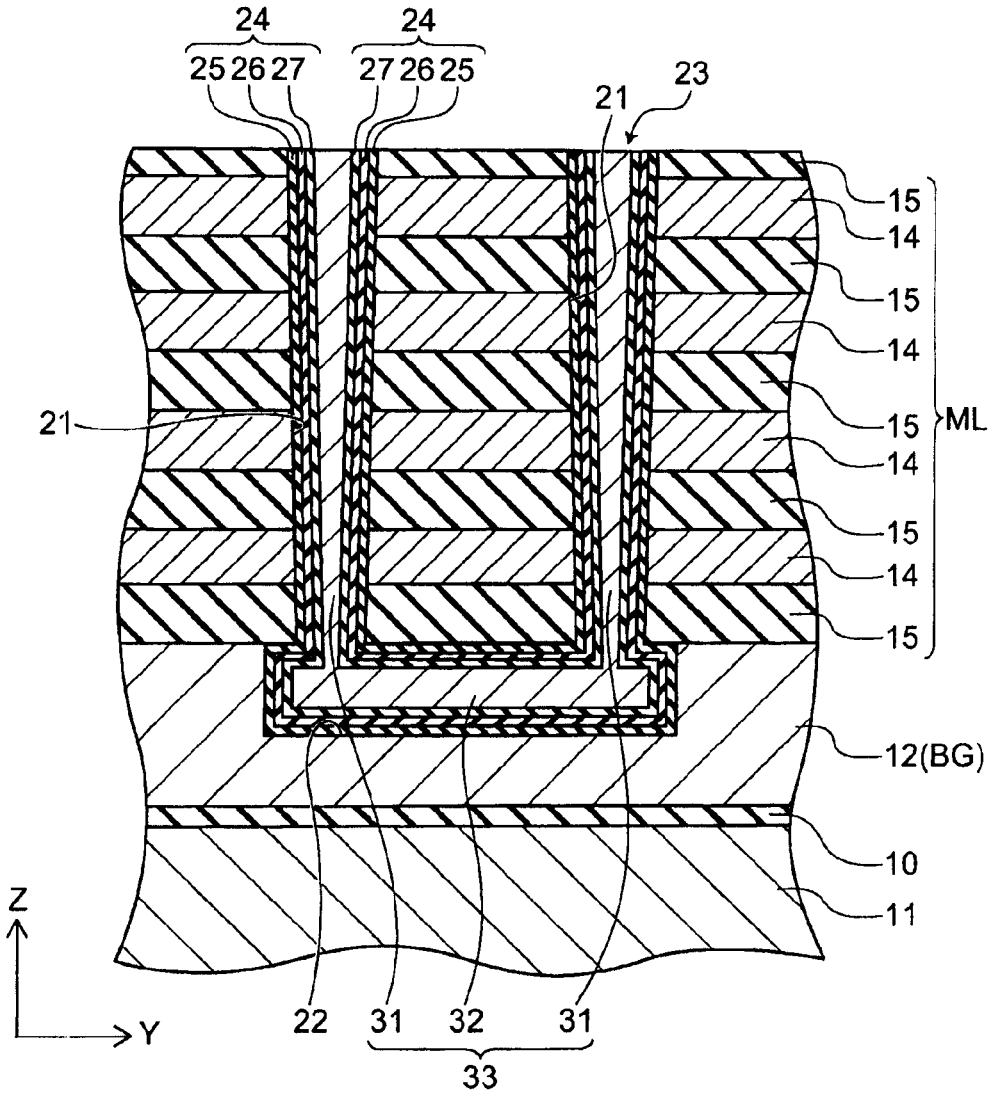
FIG. 16 is a cross-sectional view of processes of the method for manufacturing a nonvolatile semiconductor memory device according to the third embodiment.

Then, as illustrated in FIG. 16, a barrier film (not illustrated) made of, for example, silicon nitride is formed; and subsequently, a silicon oxide film, a silicon nitride film, and a silicon oxide film are continuously deposited. Thereby, the blocking film 25 made of the silicon oxide film, the charge storage film 26 made of the silicon nitride film, and the tunneling film 27 made of the silicon oxide film are stacked in this order on the inner face of the U-shaped hole 23 via the barrier film to form the ONO film 24.

Then, amorphous silicon is deposited on the entire surface. Thereby, amorphous silicon is filled into the U-shaped hole 23 to form the U-shaped silicon member 33. The U-shaped silicon member 33 is formed from the pair of silicon pillars 31 filled into the through-holes 21 and the one connection member 32 filled into the communicating hole 22. Subsequently, the amorphous silicon, the silicon oxide film, the silicon nitride film, and the silicon oxide film deposited on the stacked body ML are removed.

Figure 17:
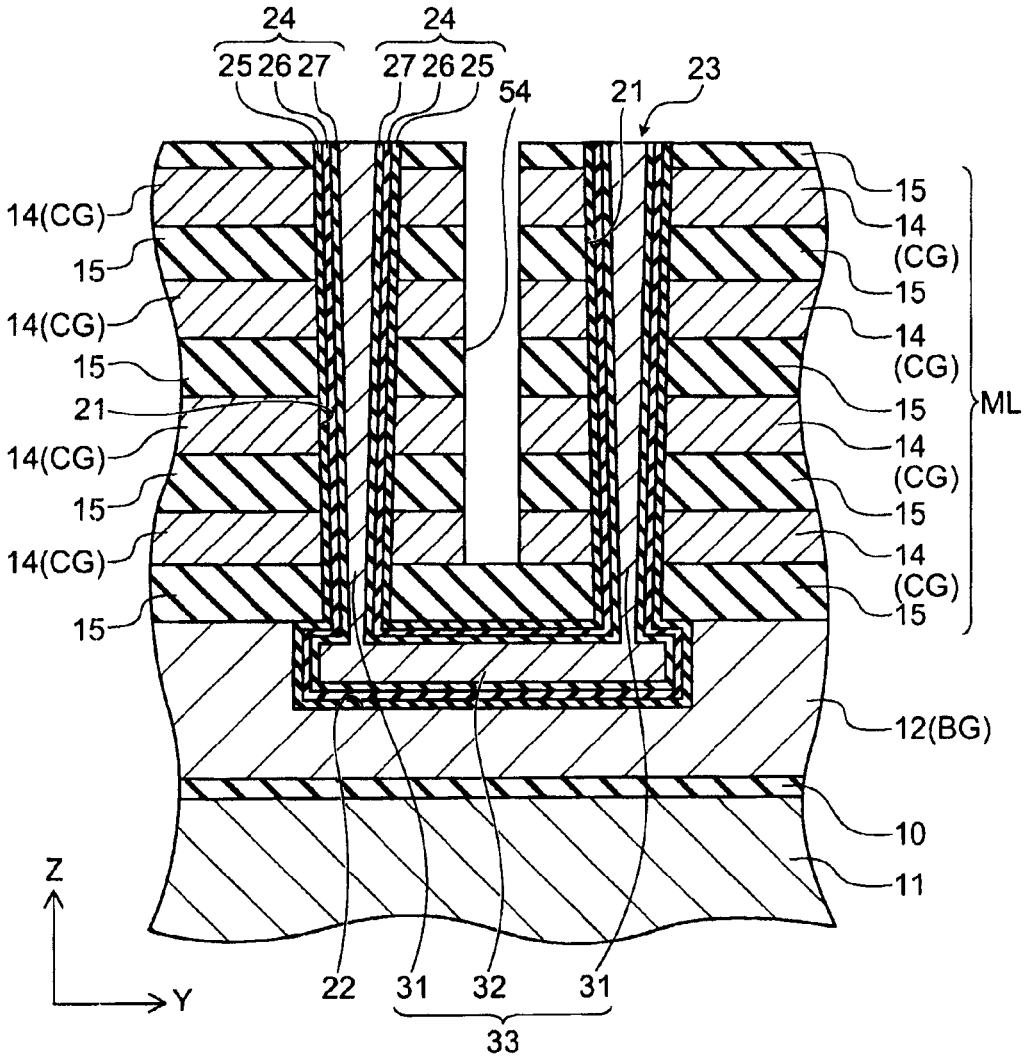
FIG. 17 is a cross-sectional view of processes of the method for manufacturing a nonvolatile semiconductor memory device according to the third embodiment.

Continuing as illustrated in FIG. 17, the stacked body ML is patterned by, for example, RIE to make trenches 54 in the stacked body ML. The trench 54 is made to align in the X direction to link the regions between the two silicon pillars 31 connected to the connection member 32 and reach the insulating film 15 of the lowermost layer.

At this time, as illustrated in FIG. 5, the trenches 54 are made to divide the electrode films 14 into a pair of mutually meshed comb-shaped patterns. In other words, the trenches 54 are made in the X-direction central portion of the stacked body ML to align in the X direction. Thereby, the electrode films 14 are divided into multiple control gate electrodes CG aligned in the X direction. At this time, the trenches 54 are not made in the regions directly above the regions between the connection members 32 in the Y direction. Thereby, each of the control gate electrodes CG is pierced by two of the silicon pillars 31 arranged along the Y direction. At both X-direction end portions of the stacked body ML, the trenches 54 are not aligned in the X direction and are made to align intermittently in the Y direction. Thereby, the control gate electrodes CGb and CGs alternately disposed along the Y direction at the X-direction central portion of the stacked body ML have common connections to each other at each of the X-direction end portions of the stacked body ML.

Figure 18:
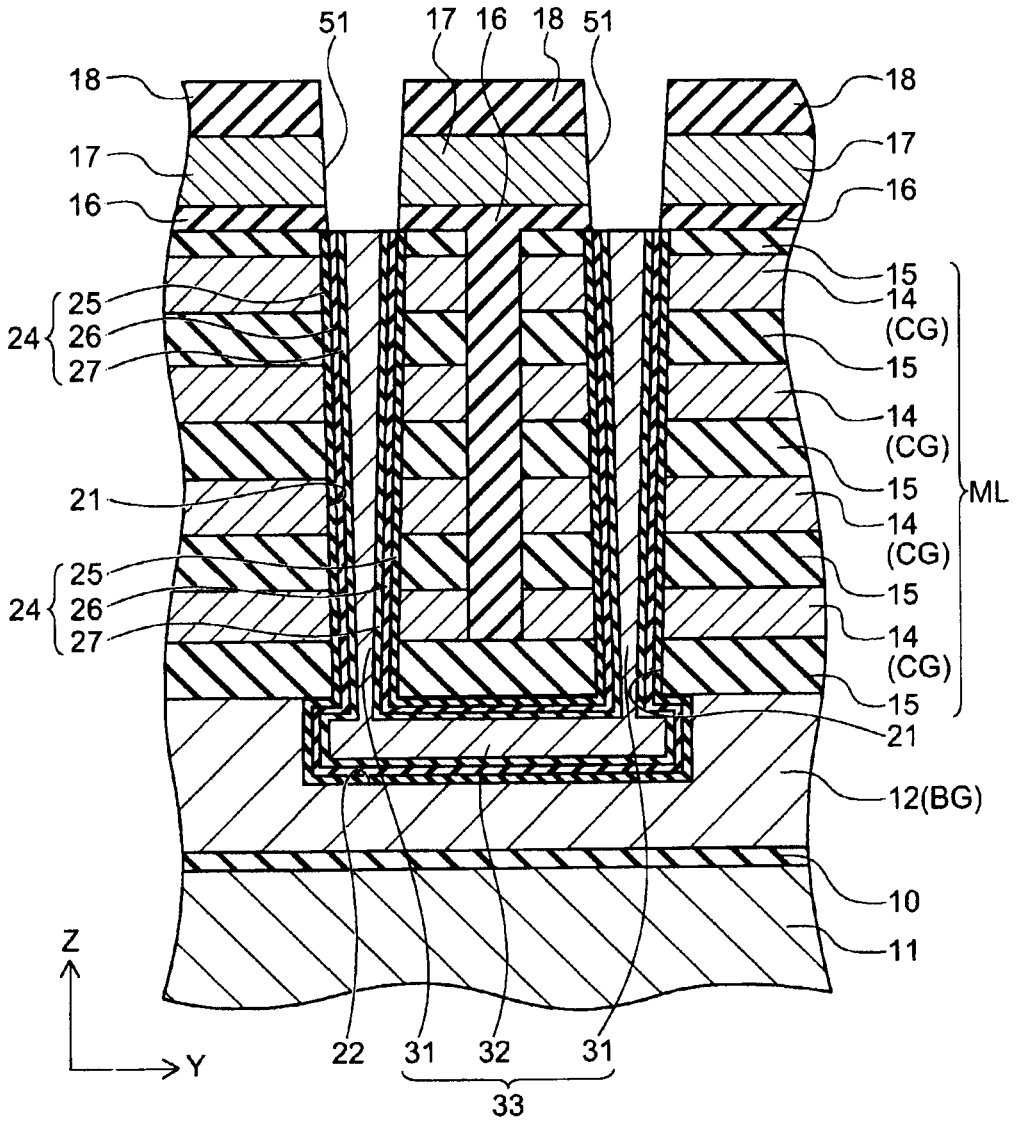
FIG. 18 is a cross-sectional view of processes of the method for manufacturing a nonvolatile semiconductor memory device according to the third embodiment.

Then, as illustrated in FIG. 18, an insulating film 16 is deposited on the stacked body ML and planarized. The insulating film 16 also is filled into the trenches 54. Then, the conductive film 17 made of, for example, amorphous silicon is deposited, etched, and left only in the memory cell region.

Then, a resist film (not illustrated) is formed, for example, on the conductive film 17; and the stacked body ML is patterned into a stairstep configuration by repeatedly performing etching using the resist film as a mask and performing slimming of the resist film. Thereby, both X-direction end portions of the control gate electrodes CG for each level are not covered with the control gate electrodes CG of the level thereabove as viewed from above (the Z direction); and in subsequent processes, contacts can be formed from above to the control gate electrodes CG of each level. Then, an etching stopper film (not illustrated) made of, for example, silicon nitride is formed to cover the stacked body ML patterned into the stairstep configuration; an inter-layer insulating film (not illustrated) is formed thereupon; and the upper face is planarized. Thereby, the inter-layer insulating film is filled around the stacked body ML.

Subsequently, the insulating film 18 is formed on the conductive film 17. The through-holes 51 are made to pierce the insulating film 18, the conductive film 17, and the insulating film 16 to reach the upper ends of the through-holes 21 in the stacked body ML.

Figure 19:
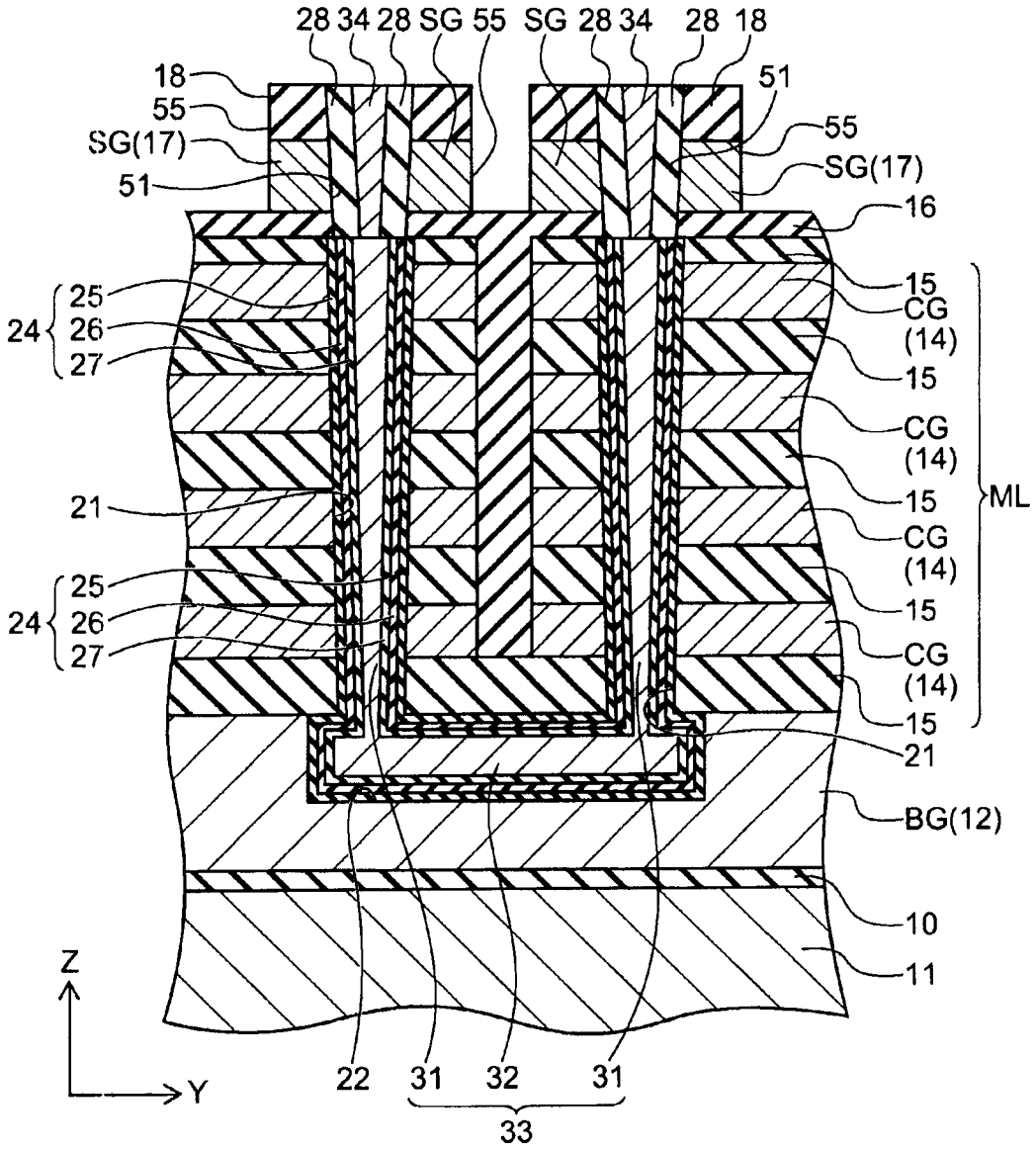
FIG. 19 is a cross-sectional view of processes of the method for manufacturing a nonvolatile semiconductor memory device according to the third embodiment.

Then, as illustrated in FIG. 19, an insulating film is deposited on the entire surface, and amorphous silicon is deposited. Etch-back is performed on the amorphous silicon and the insulating film to leave the amorphous silicon and the insulating film only in the through-holes 51. Thereby, the gate insulating film 28 is formed on the inner face of the through-holes 51 and the amorphous silicon is filled. Then, heat treatment is performed at a temperature of, for example, 600° C. to crystallize the amorphous silicon in the through-holes 51 to form polysilicon. Ion implantation is performed on the polysilicon using arsenic (As) with, for example, an acceleration voltage of 40 keV and a dose of $3\times10^{15}$ $cm^{-2}$ to form a drain diffusion layer (not illustrated). Thereby, the silicon pillars 34 are formed in the through-holes 51. The silicon pillars 34 connect to the silicon pillars 31.

Continuing, patterning by RIE and the like is performed on the insulating film 18 and the conductive film 17 to make trenches 55 aligned in the X direction in the regions between the silicon pillars 34 adjacent to each other in the Y direction. Thereby, the conductive film 17 is divided along the Y direction to form multiple selection gate electrodes SG aligned in the X direction.

Then, as illustrated in FIG. 3, the insulating film 19 is formed on the insulating film 18; source plugs SP are buried in the insulating film 19; and the source lines SL are formed on the insulating film 19 to align in the X direction. At this time, the source lines SL are connected to the drain diffusion layers of some of the silicon pillars 34 via the source plugs SR Contacts (not illustrated) are formed in the inter-layer insulating film (not illustrated) provided around the stacked body ML to connect to each of the control gate electrodes CG and each of the selection gate electrodes SG from above. Then, the insulating film 20 is formed on the insulating film 19 to cover the source lines SL. Then, the bit plugs BP are buried in the insulating films 20 and 19 and the bit lines BL are formed on the insulating film 20 to align in the Y direction. At this time, the bit lines BL are connected to the drain diffusion layers of the remaining silicon pillars 34 via the bit plugs BP. On the other hand, the drive circuit 41 (referring to FIG. 6) is formed in the peripheral circuit region by normal methods. Thereby, the nonvolatile semiconductor memory device 1 is manufactured.

According to this embodiment, the nonvolatile semiconductor memory device 1 according to the first embodiment described above can be manufactured. According to this embodiment, the drive circuit 41 supplies mutually different potentials to the control gate electrode CG of each of the levels. Thereby, the electric fields applied to the ONO films 24 of the memory transistors 35 are made to be uniform. Therefore, it is unnecessary to make the through-hole 21 diameters to be excessively uniform. Therefore, the aspect ratio of the through-hole 21 can be increased; the number of times that the through-holes 21 are made can be reduced when manufacturing the device 1 in which the prescribed number of levels of the electrode film 14 is stacked; and accordingly, the number of lithography processes can be reduced. As a result, the manufacturing cost of the nonvolatile semiconductor memory device 1 can be reduced.

The series of processes described above forming the stacked body ML, making the through-hole 21 in the stacked body ML, and filling the silicon pillar 31 into the through-hole 21 may be performed twice to manufacture a nonvolatile semiconductor memory device 2 according to the second embodiment described above. By performing the processes described above three times or more, a nonvolatile semiconductor memory device can be manufactured in which partial stacked bodies are stacked in three levels or more. In other words, portions of the through-holes 21 made in each of the partial stacked bodies are made collectively for the partial stacked body by dry etching.

Hereinabove, the invention is described with reference to exemplary embodiments. However, the invention is not limited to these exemplary embodiments. Additions, deletions, or design modifications of components or additions, omissions, or condition modifications of processes appropriately made by one skilled in the art in regard to the exemplary embodiments described above are within the scope of the invention to the extent that the purport of the invention is included.

For example, although an example is illustrated in the first embodiment described above in which the drive circuit 41 supplies mutually different potentials to the control gate electrodes CG of each of the levels for each of the writing operation, the reading operation, and the erasing operation, the invention is not limited thereto. For example, mutually different potentials may be supplied to the control gate electrodes of each of the levels only for the writing operation and the reading operation. In such a case, a common reference potential Vss may be used; and the drive circuit can be simplified. Further, mutually different potentials may be supplied to the control gate electrodes of each of the levels only for one operation selected from the writing operation, the reading operation, and the erasing operation. The configurations of the control gate electrodes and the like are not limited to those of the exemplary embodiments described above.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device, comprising:

a substrate;

a stacked body provided on the substrate, the stacked body including a plurality of insulating films alternately stacked with a plurality of electrode films, a through-hole being made in the stacked body to align in a stacking direction;

a semiconductor pillar buried in an interior of the through-hole;

a charge storage film provided between the electrode film and the semiconductor pillar; and a drive circuit supplying a potential to the electrode film, a diameter of the through-hole differing by a position in the stacking direction, the drive circuit supplying a potential to reduce a potential difference with the semiconductor pillar as a diameter of the through-hole piercing the electrode film decreases.

2. The device according to claim 1, wherein a diameter of the through-hole decreases toward the substrate.

3. The device according to claim 2, wherein the through-holes are made collectively by dry etching.

4. The device according to claim 1, wherein the stacked body includes a plurality of partial stacked bodies arranged in the stacking direction, a plurality of the insulating films and a plurality of the electrode films being disposed in the partial stacked body, and in each of the partial stacked bodies, a diameter of the through-hole decreases toward the substrate.

5. The device according to claim 4, wherein portions of the through-holes made in each of the partial stacked bodies are made collectively for the partial stacked body by dry etching.

6. The device according to claim 1, wherein the through-hole has a circular configuration as viewed from the stacking direction, and a potential provided by the drive circuit to one of the electrode films is determined according to $$V=6999.4\times r^3-1971.3\times r^2+194.66\times r-5.0952$$

where r (μm) is a diameter of a portion of the through-hole piercing the one electrode film, V is a potential difference between the one electrode film and the semiconductor pillar, and V is a relative potential difference having a potential difference of 1 when the diameter is 0.06 μm.

7. The device according to claim 1, wherein the drive circuit includes:

a decoder to output a control signal;

a pump circuit to increase a supplied potential; and a switch element to switch between connecting and disconnecting the pump circuit and the electrode film based on the control signal.

8. The device according to claim 7, wherein the pump circuit and the switch element are provided for each of the electrode films.

9. The device according to claim 1, further comprising:

a back gate disposed between the substrate and the stacked body; and a connection member provided in the back gate to connect two adjacent semiconductor pillars to each other.

10. The device according to claim 1, wherein a memory cell region and a peripheral circuit region are set in the substrate, the semiconductor pillar and the charge storage film are disposed in the memory cell region, and the drive circuit is disposed in the peripheral circuit region.

11. A method for driving a nonvolatile semiconductor memory device, the device including: a substrate; a stacked body provided on the substrate, the stacked body including a plurality of insulating films alternately stacked with a plurality of electrode films, a through-hole being made in the stacked body to align in a stacking direction; a semiconductor pillar buried in an interior of the through-hole; and a charge storage film provided between the electrode film and the semiconductor pillar, a diameter of the through-hole differing by a position in the stacking direction, the method comprising:

when applying a potential to the electrode film, supplying a potential to reduce a potential difference with the semiconductor pillar as a diameter of the through-hole piercing the electrode film decreases.

12. The method according to claim 11, comprising providing a potential to one of the electrode films, the potential being determined according to $$V=6999.4\times r^3-1971.3\times r^2+194.66\times r-5.0952$$

where r (μm) is a diameter of a portion of the through-hole piercing the one electrode film, V is a potential difference between the one electrode film and the semiconductor pillar, and V is a relative potential difference having a potential difference of 1 when the diameter is 0.06 μm, the through-hole having a circular configuration as viewed from the stacking direction.

13. The method according to claim 11, wherein the potential is a writing potential to inject an electron from the semiconductor pillar into the charge storage film.

14. The method according to claim 11, wherein the potential is a reading potential to detect whether or not an electron is stored in the charge storage film.

*15. A nonvolatile semiconductor memory device comprising:*

*a first memory cell transistor being above a semiconductor substrate;*

*a second memory cell transistor being above the first memory cell transistor;*

*a first word line electrically connected to a gate of the first memory cell transistor;*

*a second word line electrically connected to a gate of the second memory cell transistor; and*

*a control circuit configured to perform a read operation on a condition that a first voltage is applied to the first word line when a read operation for the second memory cell transistor is performed and a second voltage is applied to the second word line when a read operation for the first memory cell transistor is performed, and the first voltage being lower than the second voltage.*

*16. The device according to claim 15, wherein the first memory cell transistor includes a first part of a semiconductor body, the second memory cell transistor includes a second part of the semiconductor body, and a diameter of the first part is smaller than a diameter of the second part.*

*17. The device according to claim 15, wherein the first memory cell transistor includes a first part of a semiconductor body, the second memory cell transistor includes a second part of the semiconductor body, and a width of the first part is smaller than a width of the second part.*

*18. The device according to claim 15, further comprising:*

*a first transistor electrically connected to the first word line;*

*a second transistor electrically connected to the second word line; and*

*a first decoder electrically connected to gates of the first and second transistors.*

*19. The device according to claim 18, further comprising a plurality of pump circuits electrically connected to the first transistor and the second transistor.*

*20. The device according to claim 19, wherein*

*the first memory cell transistor includes:*

*a semiconductor pillar extending in a first direction perpendicular to the semiconductor substrate; and*

*a charge storage layer surrounding the semiconductor pillar,*

*the first word line surrounds the charge storage layer.*

*21. The device according to claim 15, further comprising:*

*a third memory cell transistor being above the second memory cell transistor; and*

*a third word line electrically connected to a gate of the third memory cell transistor,*

*wherein the control circuit is configured to perform a read operation on a condition that a third voltage is applied to the third word line when a read operation for the second memory cell transistor is performed and the first voltage is lower than the third voltage.*

*22. The device according to claim 21, wherein the control circuit is configured to perform a read operation on a condition that a fourth voltage is applied to the third word line when a read operation for the first memory cell transistor is performed and the second voltage is lower than the fourth voltage.*

*23. The device according to claim 22, wherein the third voltage is same as the fourth voltage.*

*24. The device according to claim 22, further comprising:*

*a first transistor electrically connected to the first word line;*

*a second transistor electrically connected to the second word line; and*

*a first decoder electrically connected to gates of the first and second transistors.*

*25. The device according to claim 24, further comprising a plurality of pump circuits electrically connected to the first transistor and the second transistor.*

*26. The device according to claim 25, wherein*

*the first memory cell transistor includes:*

*a semiconductor pillar extending in a first direction perpendicular to the semiconductor substrate; and*

*a charge storage layer surrounding the semiconductor pillar,*

*the first word line surrounds the charge storage layer.*

*27. A method of controlling a nonvolatile semiconductor memory device, the nonvolatile semiconductor memory device including a first memory cell transistor being above a semiconductor substrate, a second memory cell transistor being above the first memory cell transistor, a first word line being electrically connected to a gate of the first memory cell transistor, and a second word line being electrically connected to a gate of the second memory cell transistor, comprising:*

*performing a read operation on a condition that a first voltage is applied to the first word line when a read operation for the second memory cell transistor is performed and a second voltage is applied to the second word line when a read operation for the first memory cell transistor is performed, and the first voltage being lower than the second voltage.*

*28. The method according to claim 27, wherein*

*the nonvolatile semiconductor memory device further including a third memory cell transistor being above the second memory cell transistor and a third word line electrically connected to a gate of the third memory cell transistor, and*

*the read operation is performed on a condition that a third voltage is applied to the third word line when a read operation for the second memory cell transistor is performed, the first voltage is lower than the third voltage.*

*29. The method according to claim 28, wherein the read operation is performed on a condition that a fourth voltage is applied to a gate of the third memory cell transistor when a read operation for the first memory cell transistor is performed and the second voltage is lower than the fourth voltage.*

*30. The method according to claim 29, wherein the third voltage is same as the fourth voltage.*

* * * * *